(12) United States Patent
Itou

(10) Patent No.: US 6,430,097 B1
(45) Date of Patent: Aug. 6, 2002

(54) SEMICONDUCTOR MEMORY DEVICE ENABLING REDUCTION OF TEST TIME PERIOD

(75) Inventor: Takashi Itou, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,023

(22) Filed: Jul. 9, 2001

(30) Foreign Application Priority Data

Jan. 4, 2001 (JP) ........................................ 2001-000019

(51) Int. Cl.[7] ................................................ G11C 7/00
(52) U.S. Cl. .............. 365/201; 365/189.08; 365/230.06
(58) Field of Search ........................... 365/201, 189.08, 365/202, 230.08, 230.06, 189.05

(56) References Cited

U.S. PATENT DOCUMENTS 5,896,331 A * 4/1999 Crafts ......................... 365/201
5,912,851 A * 6/1999 Matsuoka ............... 365/189.01
5,925,141 A * 7/1999 Ariki .......................... 365/201
5,996,106 A * 11/1999 Seyyedy ................ 365/189.05
6,003,149 A * 12/1999 Nevill et al. ................. 714/718

FOREIGN PATENT DOCUMENTS

JP          5-282885          10/1993

* cited by examiner

Primary Examiner—Richard Elms
Assistant Examiner—Hien Nguyen
(74) Attorney, Agent, or Firm—McDermott, Will & Emery

(57) ABSTRACT

A VBL generation circuit which normally outputs an equalizing potential outputs a potential corresponding to writing data in the test mode and this potential is collectively supplied to the bit lines by an equalizing circuit. In the test mode, a row decoder collectively activates the selected word lines by setting the pre-decode signals RX0 to RX3 to the active condition and by controlling the pre-decode signals X0 to X3 in accordance with the test signal. Accordingly, a writing in of a test pattern, wherein the detection of a short circuit between the storage nodes of memory cells is possible, can be carried out rapidly.

11 Claims, 17 Drawing Sheets

| | NORMAL OPERATION | TEST OPERATION | |
|---|---|---|---|
| | | WRITING IN OF H | WRITING IN OF L |
| ZMTX0 | H | H/L | H/L |
| ZMTX1 | H | H/L | H/L |
| ZMTX2 | H | H/L | H/L |
| ZMTX3 | H | H/L | H/L |
| VBLH | L | H | L |
| VBLL | L | L | H |

|  | NORMAL OPERATION | TEST OPERATION |
|---|---|---|
| ZMTX0 | H | H/L |
| ZMTX1 | H | H/L |
| ZMTX2 | H | H/L |
| ZMTX3 | H | H/L |
| SO1 | SO | L |
| BLEQ1 | BLEQ | H |

| WL ACTIVATED AT SAME TIME | | CELL PATTERN |
|---|---|---|
| T1 | T2 | |
| X0,X1,X2,X3 | --- | CELL ALL 0/1  |
| X0 | X1,X2,X3 | SURROUNDING  |
| X1 | X0,X2,X3 | |
| X2 | X0,X1,X3 | |
| X3 | X0,X1,X2 | |
| X0,X1 | X2,X3 | CELL ROW STRIPE  |
| X0,X2 | X1,X3 | CELL CHECKER  |
| X0,X3 | X1,X2 | CELL COLUMN STRIPE  |

|  | NORMAL OPERATION | WRITING IN TEST OPERATION (EVEN, ODD) | | | |
|---|---|---|---|---|---|
|  |  | (H,H) | (H,L) | (L,H) | (L,L) |
| ZMTX0 | H | H/L | H/L | H/L | H/L |
| ZMTX1 | H | H/L | H/L | H/L | H/L |
| ZMTX2 | H | H/L | H/L | H/L | H/L |
| ZMTX3 | H | H/L | H/L | H/L | H/L |
| VBLEH | L | H | H | L | L |
| VBLEL | L | L | L | H | H |
| VBLOH | L | H | L | H | L |
| VBLOL | L | L | H | L | H |

SEMICONDUCTOR MEMORY DEVICE ENABLING REDUCTION OF TEST TIME PERIOD

BACKGROUND OF THE INVENTION

1. Field of the Invention

The present invention relates to a semiconductor memory device and, in particular, to a semiconductor memory device such as a dynamic random access memory (DRAM) wherein it is possible to inspect contact defects between memory cells in a short period time.

2. Description of the Background Art

FIG. 18 is a block diagram showing a schematic configuration of a semiconductor memory device 502 according to a prior art.

Referring to FIG. 18, the semiconductor memory device 502 includes a memory cell array 14 having a plurality of memory cells arranged in rows and columns, an address buffer 5 which receives address signals A0 to A12 and outputs an internal row address X and an internal column address Y, and a control signal input buffer 6 which captures control signals /OE, /RAS, /CAS and /WE and outputs internal control signals INTZRAS, INTZCAS and INTZWE.

The memory cell array 14 includes memory cells MC arranged in rows and columns, a plurality of word lines WL provided to correspond to the rows of memory cells MC and bit line pairs BLP provided in correspondence with the columns of the memory cells MC. In FIG. 18, one memory cell MC, one word line WL and one bit line pair BLP are shown in an exemplary manner.

The semiconductor memory device 502 further includes a control circuit 8 which receives an internal address signal from the address buffer 5 and receives the internal control signals INTZRAS, INTZCAS and INTZWE from the control signal input buffer 6 so as to output a control signal to each block.

The control circuit 8 includes a circuit which receives the internal control signals, INTZRAS, INTZCAS and INTZWE, and outputs a signal S0, which activates the sense amplifier, and an equalizing signal BLEQ, which activates the equalizing circuit of the sense amplifier band.

The semiconductor memory device 502 further includes a row decoder 510 which decodes the row address signal X given from the address buffer 5. The row decoder 510 includes a word driver for driving the addressed row (word line) inside of the memory cell array 14 into the selected condition.

The semiconductor memory device 502 further includes a column decoder 12 which decodes the internal column address Y given from the address buffer 5 so as to generate a column selection signal and a sense amplifier band 516 wherein a plurality of sense amplifiers, which carry out detection and amplification of data of memory cells MC connected to the selected row in the memory cell array 14, are arranged.

The semiconductor memory device 502 further includes an input buffer 22 which receives writing data from the outside and generates internal writing data, a writing driver which amplifies the internal writing data from the input buffer 22 and transmits them to the selected memory cell, a preamplifier which amplifies the data read out from the selected memory cell and an output buffer 20 which further carries out buffer processing on the data from this preamplifier and outputs them to the outside.

In FIG. 18, the preamplifier and the writing driver are shown as one block, the block 18.

FIG. 19 is a circuit diagram showing the configuration of the row decoder 510 in FIG. 18.

Referring to FIG. 19, the row decoder 510 includes a pre-decoder 532, which pre-decodes the lowest two bits in the row address, a pre-decoder 536, which decodes the rest except for the lowest two bits in the row address, and a main decoder 38, which selects a word line in accordance with the outputs of the pre-decoders 532 and 536.

The pre-decoder 532 receives signals RA0 and RA1, which correspond to the lowest two bits of the row address, and signals ZRA0 and ZRA1, which are, respectively, complementary to the signals RA0 and RA1. The pre-decoder 536 receives the signals RA2 to RA12, which correspond to the row address except for the lowest two bits, and the signals ZRA2 to ZRA12, which are, respectively, complementary to the signals RA2 to RA12.

The pre-decoder 532 includes a NAND circuit 540 which receives the signals ZRA0 and ZRA1, an inverter 542 which inverts by receiving the output of the NAND circuit 540 and outputs a pre-decode signal X0, a NAND circuit 544 which receives the signals RA0 and ZRA1, and an inverter 546 which inverts by receiving the output of the NAND circuit 544 and outputs a pre-decode signal X1.

The pre-decoder 532 further includes a NAND circuit 548 which receives signals ZRA0 and RA1, an inverter 550 which inverts by receiving the output of the NAND circuit 548 and outputs a pre-decode signal X2, a NAND circuit 552 which receives signals RA0 and RA1 and an inverter 554 which inverts by receiving the output of the NAND circuit 552 and outputs a pre-decode signal X2.

The pre-decoder 536 includes the pre-decode circuits 556, 558, . . . , 560 which output, respectively, pre-decode signals RX0, RX1 . . . , RX2047.

The pre-decode circuit 556 includes a NAND circuit 562 which receives the signals ZRA2 to ZRA12, and an inverter 564 which inverts by receiving the output of the NAND circuit 562 and outputs a pre-decode signal RX0.

The pre-decode circuit 558 includes a NAND circuit 566 which receives the signal RA2 and the signals ZRA3 to ZRA12, and an inverter 568 which inverts by receiving the output of the NAND circuit 566 and outputs a pre-decode signal RX1.

The pre-decode circuit 560 includes a NAND circuit 570 which receives the signals RA2 to RA12, and an inverter 572 which inverts by receiving the output of the NAND circuit 570 and outputs a pre-decode signal RX2047.

The main decoder 38 includes decode circuits 72, 74, . . . , 76 which activate corresponding word lines in accordance with the respective pre-decode signals RX0, RX1, . . . , RX2047.

The decode circuit 72 includes a NAND circuit 78 which receives the pre-decode signals RX0 and X0, an inverter 80 which inverts by receiving the output of the NAND circuit 78, a NAND circuit 82 which receives the pre-decode signals RX0 and X1, an inverter 84 which inverts by receiving the output of the NAND circuit 82, a NAND circuit 86 which receives the pre-decode signals RX0 and X2, an inverter 88 which inverts by receiving the output of a NAND circuit 86, a NAND circuit 90 which receives the pre-decode signals RX0 and X3, and inverter 92 which inverts by receiving the output of the NAND circuit 90. The inverters 80, 84, 88 and 92 operate as word drivers for driving, respectively, the word lines WL0, WL1, WL2 and WL3.

Though the decode circuit 74 is different from the decode circuit 72 in the point that the pre-decode signal RX1 is received in place of RX0 and the word lines WL4 to WL7 are, respectively, activated in place of the word lines WL0 to WL3. Since the circuit configuration of the decode circuit 74 is similar to that of the decode circuit 72, the description is not repeated.

Though the decode circuit 76 is different from the decode circuit 72 in the point that the pre-decode signal RX2047 is received in place of RX0 and the word lines WLn-3 to WLn are, respectively, activated in place of the word lines WL0 to WL3. Since the circuit configuration of the decode circuit 76 is similar to that of the decode circuit 72, the description is not repeated.

The row decoder can, finally, select 4×2048, that is to say, 8192 word lines.

FIG. 20 is a view partially showing the manner of memory cell arrangement of the memory cell array 14 as shown in FIG. 18.

Here, a part of the row decoder and a column decoder as well as sense amplifiers and bit line equalizing circuits are depicted in FIG. 20 for reference.

Referring to FIG. 20, memory cells are arranged in a so-called half pitch configuration. In the half pitch configuration, one cell is surrounded by eight adjacent cells. One of the reasons for memory cell defects is a short circuit between a storage node and a storage node (SN—SN) due to a short circuit between adjacent cells. As a test pattern which has a high detection performance for such defects, a surrounding pattern exists.

As shown in FIG. 20, the surrounding pattern is a test pattern wherein, with respect to a memory cell (hereinafter referred to as a noteworthy cell) which is the subject of the inspection for the occurrence of a short circuit, the eight adjacent cells (hereinafter referred to as adjacent cells) surrounding the noteworthy cell have the opposite polarity in the writing data.

FIG. 20 shows a pattern for writing "H" data in the noteworthy cell and "L" data in the eight adjacent cells. There is, of course, the case where the polarity of the writing data is reversed. In order to write the surrounding pattern in a memory cell array of the half pitch configuration, the data of the opposite polarity may be written in all of the cells of a column of every 4th word line.

The description corresponding to FIG. 20 is given as follows: in the case of the pre-decode signal X3="H", "H" data are written in a memory cell and in the case of pre-decode signals X0, X1, X2="H, H, H", "L" data are written into a memory cell.

In the case of changing the noteworthy cell, writing may be carried out by changing the pre-decode signal which is activated from the pre-decode signal X3 to any of the pre-decode signals X0, X1 and X2.

In the case that there is a short circuit between SN—SN, in particular in the case that there is a short circuit between storage nodes of a plurality of adjacent memory cells, defect detection can be carried out by using a surrounding pattern. At the time of testing, first, the surrounding pattern is written into all of the bits of the memory cells according to a conventional writing function. Then, after that, no writing is carried out on the noteworthy cell and the restoring of data is repeatedly carried out on the eight adjacent cells surrounding the noteworthy cell.

Restoring is more concretely described here. For example, in the case that the word line selected by the pre-decode signal X3 is for the noteworthy cell, as shown in FIG. 20, the surrounding pattern which makes the data of the noteworthy cell "H" data is once written in.

After that, word lines corresponding to the pre-decode signals X0 to X2, that is to say, the word lines WL0, WL1, WL2, WL4, WL5, WL6, . . . are activated in order so that the writing of "L" data into a memory cell is repeated.

If there is a short circuit between SN—SN the potential of the noteworthy cell becomes close to the potential of the adjacent cells. The potential of the adjacent cells wherein a short circuit occurs becomes, of course, close to the potential of the noteworthy cell.

However, since restoring is carried out on the adjacent cells, the potential of the adjacent cells, which once becomes a middle potential, is again set at the potential corresponding to the "L" data. Then, the potential of the noteworthy cell is further lowered from the potential corresponding to the "H" data to the potential corresponding to the "L" data. Accordingly, since the potential of the noteworthy cell is soon inverted to the opposite polarity, defects can be detected when the reading is carried out.

In the case that the detection of a short circuit between SN—SN by means of the surrounding pattern is carried out for the memory cells of the entire surface of the memory cell array, however, it is necessary to carry out the detection by selecting the noteworthy cell in four different ways. That is to say, since there are four patterns of word lines which are to be activated for writing the opposite polarity data, the test time tends to take a long period of time in the case that these writings are carried out by means of a conventional writing function. That is to say, the operation of repeating the selection of the word lines in sequence four times is necessary in order to write a necessary surrounding pattern. Furthermore, the writing time is doubled when the inversion of the polarity of the data is taken into consideration.

SUMMARY OF THE INVENTION

An object of this invention is to provide a semiconductor memory device which can carry out the writing of a test pattern easily and in a short time over the entire surface of a memory cell array.

Briefly stated, this invention relates to a semiconductor memory device which has a normal operation mode and a test mode and includes a memory array, a plurality of bit lines, a plurality of word lines and a row decode circuit.

The memory array includes a plurality of memory cells which are arranged in rows and columns. The plurality of bit lines are arranged along the column direction and carries out the writing and the reading of data on the plurality of memory cells. The plurality of word lines are arranged along the row direction and select a particular memory cell from among the plurality of memory cells.

The plurality of word lines is divided into first to fourth word line groups. The first word line group includes word lines which correspond to the (4m+1)th, where m is a nonnegative integer, when the first word line is counted as first from among the plurality of word lines. The second word line group includes word lines which correspond to the (4m+2)th when the first word line is counted as first. The third word line group includes word lines which correspond to the (4m+3)th when the first word line is counted as first. The fourth word line group includes word lines which correspond to the (4m+4)th when the first word line is counted as first.

The row decode circuit activates the plurality of word lines, by making the first to the fourth word line groups the unit of activation, in accordance with the address signal in the test mode.

Accordingly, the main advantage of this invention is that, since a test pattern can be written into a memory cell array in a short period of time, the test time can be reduced and the production efficiency is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
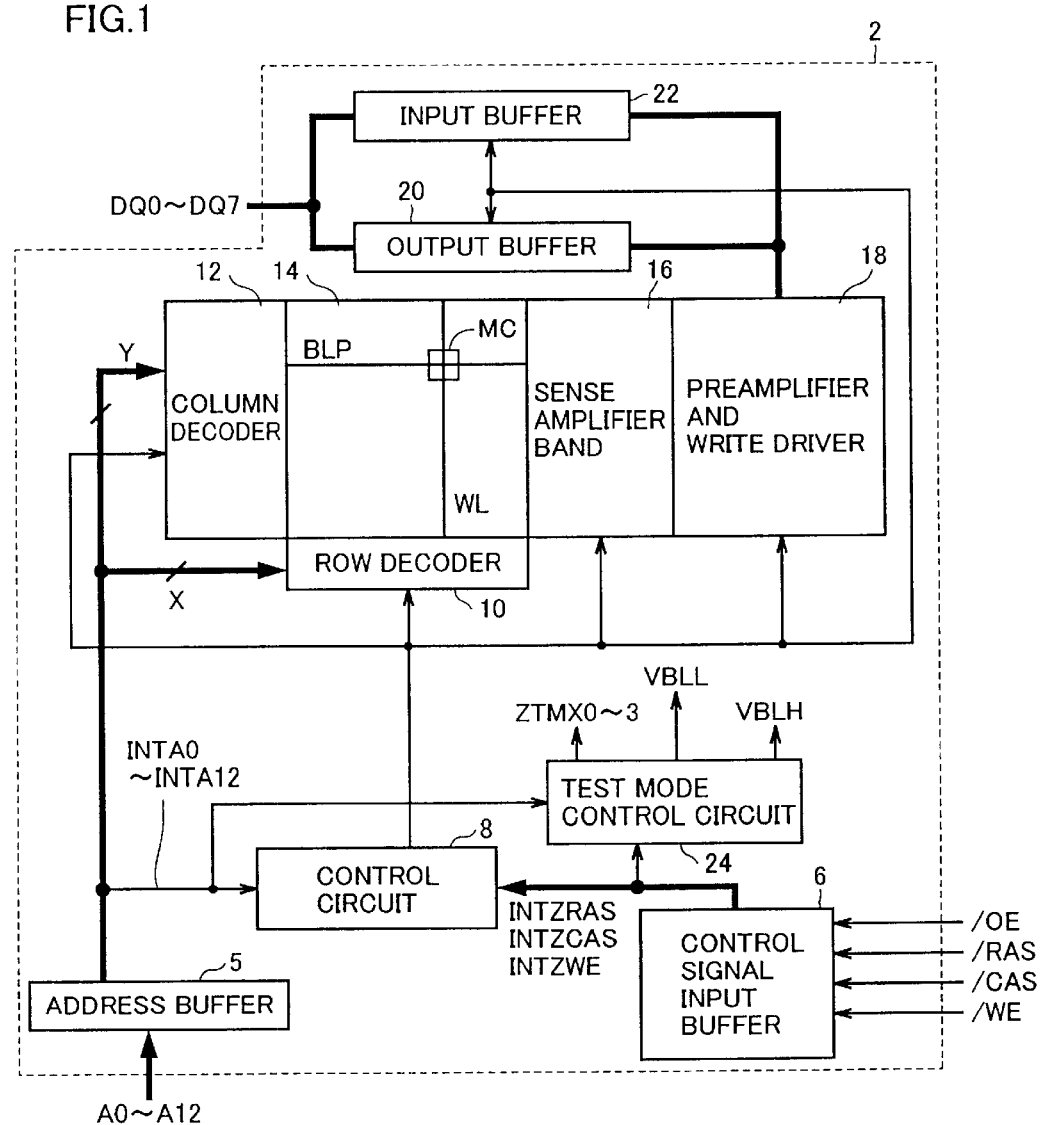
FIG. 1 is a block diagram showing the schematic configuration of a semiconductor memory device 2 according to a first embodiment of the present invention.

In the following, the embodiments of the present invention are described in detail referring to the drawings. Here, the same numerals in the figures show the same or corresponding parts.

[First Embodiment]

FIG. 1 is a block diagram showing a schematic configuration of a semiconductor memory device 2 according to Mode 1 of the present invention.

Referring to FIG. 1, the semiconductor memory device 2 includes a memory cell array 14 which has a plurality of memory cells arranged in rows and columns, an address buffer 5 which receives the address signals A0 to A12 and outputs the internal row address X and the internal column address Y, and a control signal input buffer 6 which takes in the control signals /OE, /RAS, /CAS and /WE and outputs the internal control signals INTZRAS, INTZCAS and INTZWE.

The memory cell array 14 includes memory cells MC arranged in rows and columns, a plurality of word lines WL provided corresponding to rows of the memory cells MC, and bit line pairs BLP provided in accordance with columns of the memory cells MC. In FIG. 1, one memory cell MC, one word line WL and one bit line pair BLP are shown in an exemplary manner.

The semiconductor memory device 2 further includes a control circuit 8 which receives the internal address signals from the address buffer 5 and which receives the internal control signals INTZRAS, INTZCAS and INTZWE from the control signal input buffer 6 so as to output a control signal to each block.

The control circuit 8 includes a circuit which outputs the signal S0 for activating a sense amplifier and the equalizing signal BLEQ which activates an equalizing circuit of the sense amplifier band by receiving the internal control signals INTZRAS, INTZCAS and INTZWE.

The semiconductor memory device 2 further includes a row decoder 10 which decodes the row address signal X given from the address buffer 5. The row decoder 10 includes a word driver for driving the row (word line) addressed inside of the memory cell array 14 into a selected condition.

The semiconductor memory device 2 further includes a column decoder 12 which decodes the internal column address Y given from the address buffer 5 so as to generate a column selection signal, and a sense amplifier bane 16 wherein a plurality of sense amplifiers, which carry out detection and amplification of data of a memory cell MC connected to a selected row of the memory cell array 14, are arranged.

The semiconductor memory device 2 further includes an input buffer 22 which receives writing data from the outside and generates internal writing data, a write driver which amplifies the internal writing data from the input buffer 22 and transmits them to a selected memory cell, a preamplifier which amplifies the data read out from the selected memory cell and an output buffer 20 which further carries out buffer processing on the data from this preamplifier and outputs them to the outside.

In FIG. 1, the preamplifier and the write driver are shown as one block, the block 18.

The semiconductor memory device 2 further includes a test mode control circuit 24 which receives the internal address signals INTA0 to INTA12 from the address buffer 5 and which receives INTZRAS, INTZCAS and INTZWE from the control signal input buffer 6 so as to output the test signals ZTMX0 to ZTMX3, VBLL and VBLH.

Figures 2, 3:
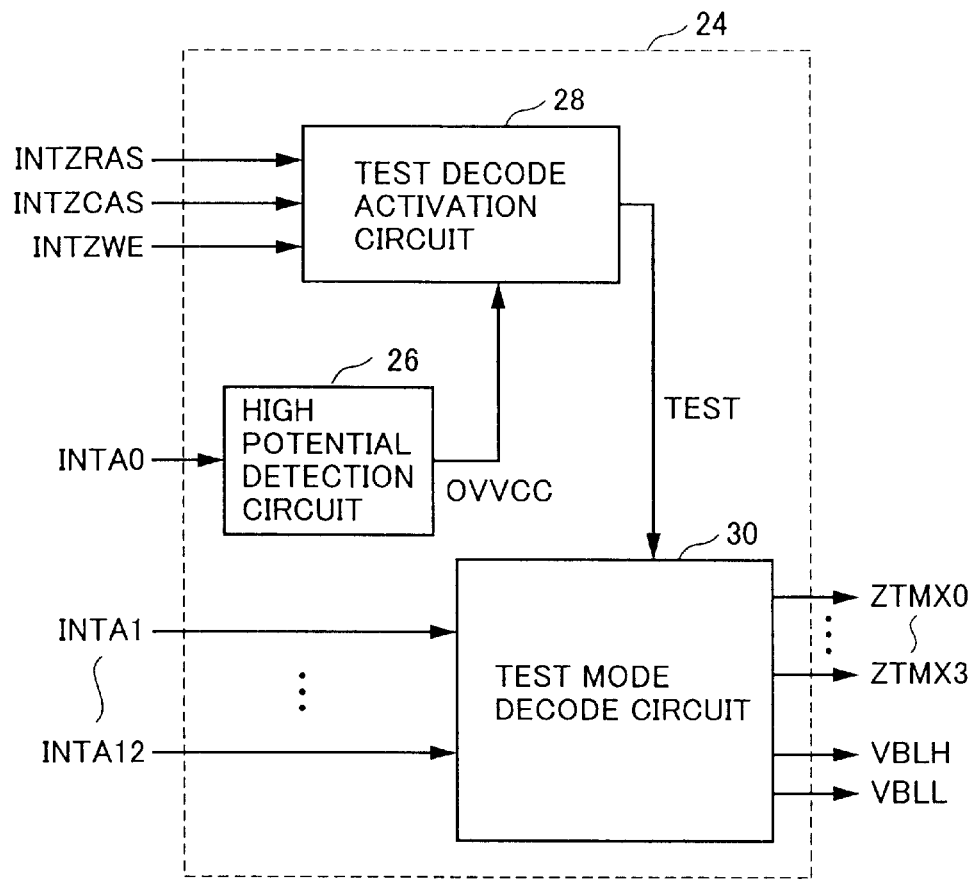
FIG. 2 is a block diagram showing the configuration of a test mode control circuit 24 in FIG. 1.
FIG. 3 is a diagram for describing the operation of a test mode decode circuit 30 in FIG. 2.

FIG. 2 is a block diagram showing the configuration of the test mode control circuit 24 in FIG. 1.

Referring to FIG. 2, the test mode control circuit 24 includes a high potential detection circuit 26 which activates the detection signal OVVCC when the internal address signal INTA0 becomes a potential higher than the power source potential Vcc, a test decode activation circuit 28 which activates the signal TEST by detecting the test mode in the case that the control signals INTZRAS, INTZCAS and INTZWE exhibit predetermined changes while the detection signal OVVCC is activated, and a test mode decode circuit 30 which outputs the test signals ZTMX0 to ZTMX3, VBLH and VBLL in accordance with the internal address signals INTA1 to INTA12 at the time of activation of the signal test.

FIG. 3 is a diagram for describing the operation of the test mode decode circuit 30 in FIG. 2.

Referring to FIGS. 2 and 3, the test mode decode circuit 30 sets the test signals ZMTX0 to ZMTX3 at the "H" level at the time of the normal operation where the test signal TEST is at the "L" level. At this time, the test mode decode circuit 30 sets both the test signals VBLH and VBLL at the "L" level.

On the other hand, at the time of the test operation where the test signal TEST is activated at the "H" level, the test mode decode circuit 30 sets the test signal VBLH at "H" and sets the test signal VBLL at the "L" level when "H" data are written into a memory cell. Then, each of the test signal ZMTX0 to ZMTX3 can be set either at the "H" level or at the "L" level by controlling the address signal from the outside.

In addition, in the case that "L" data are written into a memory cell at the time of the test operation, the test mode decode circuit 30 sets the test signal VBLH at the "L" level and sets the test signal VBLL at the "H" level. Then, each of the test signal ZMTX0 to ZMTX3 can be set either at the "H" level or at the "L" level by controlling the address signal from the outside.

For example, one bit among the internal address signals INTA1 to INTA12 is used for the selection whether "H" data are written in or "L" data are written in while four bits among the other bits are used for selecting the test signals ZMTX0 to ZMTX3, respectively, and thereby, the test mode decode circuit 30 can be implemented.

Figure 4:
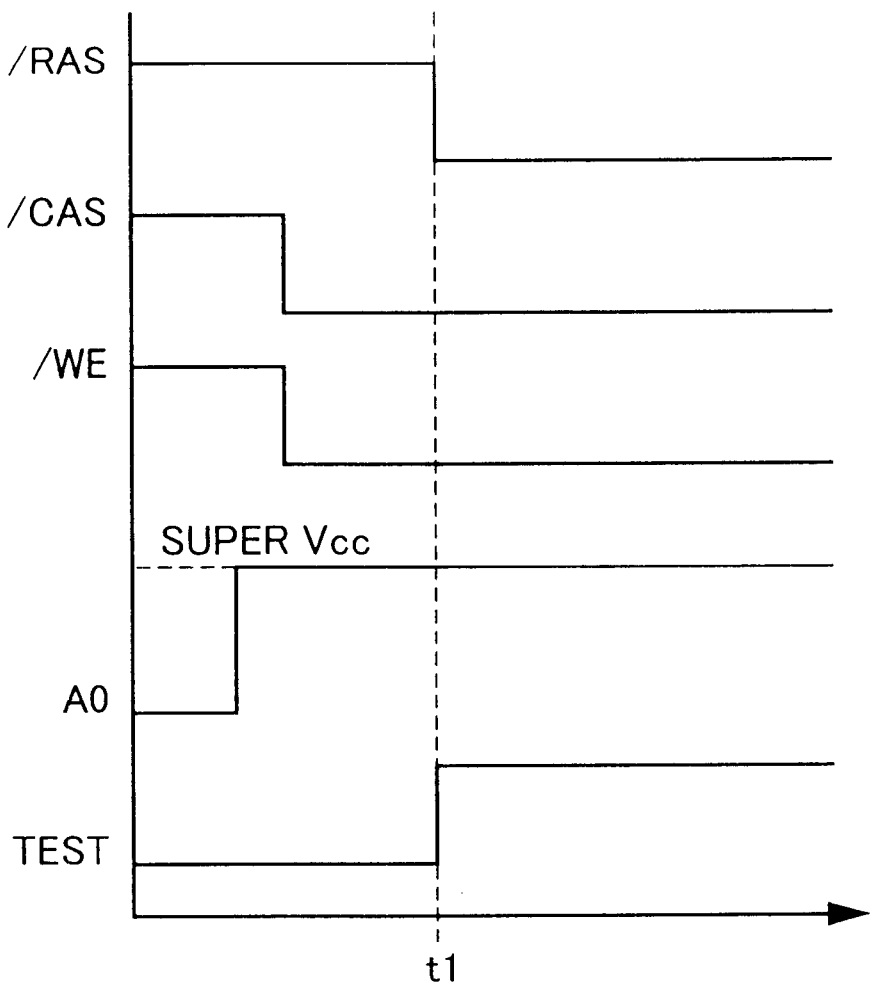
FIG. 4 is an operation waveform diagram for describing the operation of a test decode activation circuit 28 in FIG. 2.

FIG. 4 is an operation waveform diagram for describing the operation of the test decode activation circuit 28 in FIG. 2.

First, in the case that the potential superVcc which is higher than the normal power source potential Vcc is given to the address signal A0 which is given from the outside, the high potential detection circuit 26 activates the detection signal OVVCC. After this, when a so-called "CAS before RAS," where the control signal /RAS is dropped after the control signals /CAS and /WE are dropped, is inputted, the test decode activation circuit 28 raises the test signal from the "L" level to the "H" level at the time t1. In this manner, the test mode is started.

Figure 5:
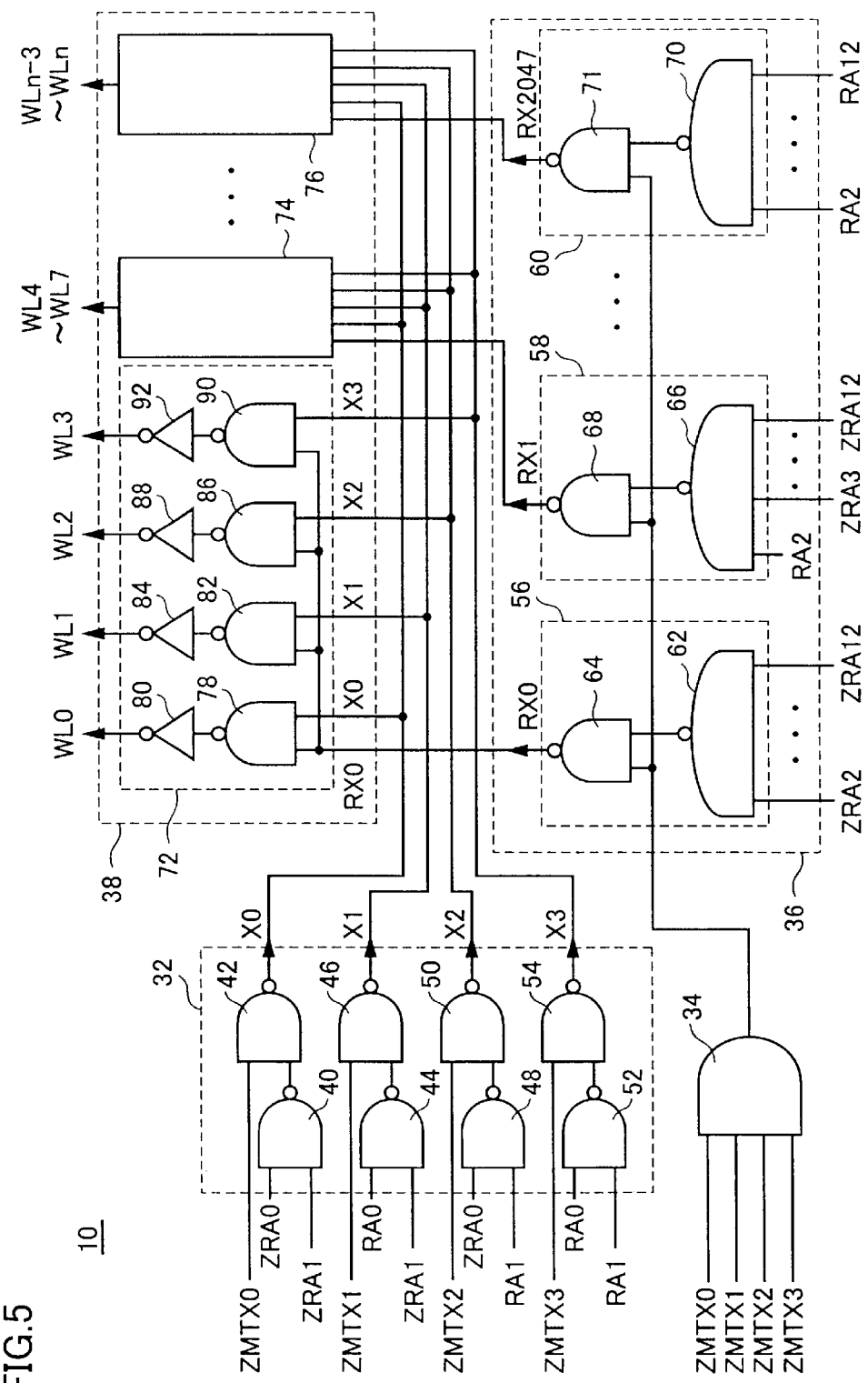
FIG. 5 is a circuit diagram showing the configuration of a row decoder 10 in FIG. 1.

FIG. 5 is a circuit diagram showing the configuration of the row decoder 10 in FIG. 1.

Referring to FIG. 5, the row decoder 10 includes an AND circuit 34 which receives the test signals ZMTX0 to ZMTX3, a pre-decoder 32 which pre-decodes the lowest two bits within the address signal, a pre-decoder 36 which pre-decodes the part except for the lowest two bits within the address signal and a main decoder 38 which selects a word line in accordance with the outputs of the pre-decoders 32 and 36.

The pre-decoder 32 includes a NAND circuit 40 which receives the signals ZRA0 and ZRA1, a NAND circuit 42 which receives the output of the NAND circuit 40 and the test signal ZMTX0 so as to output a pre-decode signal X0, a NAND circuit 44 which receives the signals RA0 and ZRA1, and a NAND circuit 46 which receives the output of the NAND circuit 44 and the test signal ZMTX1 so as to output a pre-decode signal X1.

The pre-decoder 32 further includes a NAND circuit 48 which receives the signals ZRA0 and RA1, a NAND circuit 50 which receives the output of the NAND circuit 48 and the test signal ZMTX2 so as to output a pre-decode signal X2, a NAND circuit 52 which receives the signals RA0 and RA1, and a NAND circuit 54 which receives the output of the NAND circuit 52 and the test signal ZMTX3 so as to output a pre-decode signal X3.

The pre-decoder 36 includes decode circuits 56, 58, . . . , 60 which output pre-decode signals RX0, RX1, . . . , RX2047, respectively.

The decode circuit 56 includes a NAND circuit 62 which receives the signals ZRA2 to ZRA12 and a NAND circuit 64 which receives the output of the NAND circuit 62 and the output of the AND circuit 34 so as to output a pre-decode signal RX0.

The decode circuit 58 includes a NAND circuit 63 which receives the signal RA2 and the signals ZRA3 to ZRA12, and a NAND circuit 68 which receives the output of the NAND circuit 66 and the output of the AND circuit 34 so as to output a pre-decode signal RX1.

The decode circuit 60 includes a NAND circuit 70 which receives the signals RA2 to RA12, and a NAND circuit 71 which receives the output of the NAND circuit 70 and the output of the AND circuit 34 so as to output a pre-decode signal RX2047.

The main decoder 38 includes decode circuits 72, 74, . . . , 76 which activate corresponding word lines in accordance with the pre-decode signals RX0, RX1, . . . , RX2047, respectively.

The pre-decode circuit 72 includes a NAND circuit 78 which receives pre-decode signals RX0 and X0, an inverter 80 which inverts by receiving the output of the NAND circuit 78, a NAND circuit 82 which receives pre-decode signals RX0 and X1, an inverter 84 which inverts by receiving the output of the NAND circuit 82, a NAND circuit 86 which receives pre-decode signals RX0 and X2, an inverter 88 which inverts by receiving the output of the NAND circuit 86, a NAND circuit 90 which receives pre-decoded signals RX0 and X3, and an inverter 92 which inverts by receiving the output of the NAND circuit 90. The inverters 80, 84, 88 and 92 operate as word drivers for driving the word lines WL0, WL1, WL2 and WL3, respectively.

Though the decode circuit 74 differs from the decode circuit 72 in the point that a pre-decode signal RX1 in place of RX0 is received so as to activate the word lines WL4 to WL7 in place of the word lines WL0 to WL3, respectively. Since the circuit configuration of the decode circuit 74 is the same as that of the decode circuit 72, the description thereof is not repeated.

The decode circuit 76 differs from the decode circuit 72 in the point that a pre-decode signal RX2047 in place of RX0 is received so as to activate the word lines WLn-3 to WLn in place of the word lines WL0 to WL3, respectively. Since the circuit configuration of the decode circuit 76 is the same as that of the decode circuit 72, the description thereof is not repeated.

The row decoder 10 can ultimately select 4×2048, that is to say, 8192 word lines.

Figure 6:
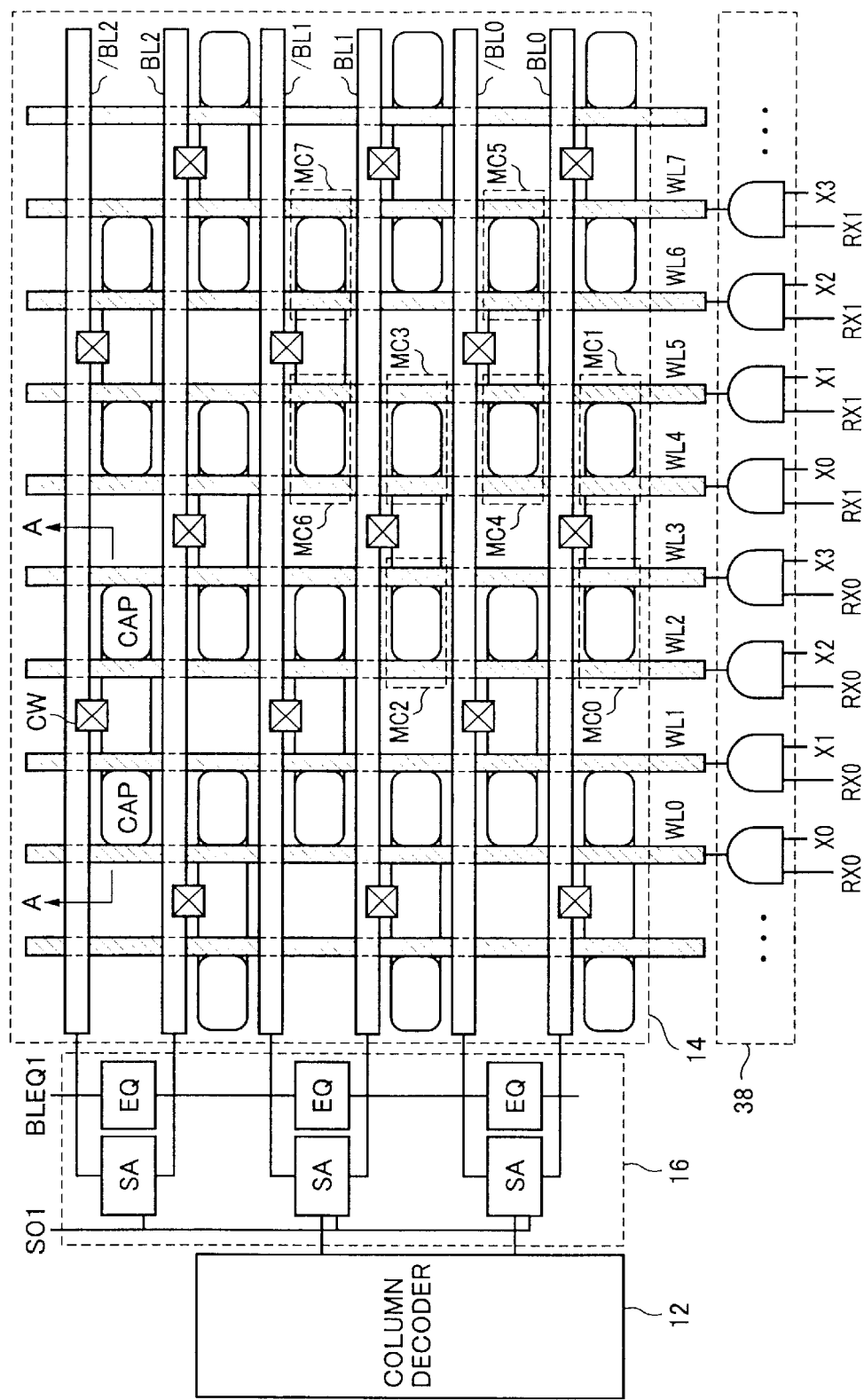
FIG. 6 is an arrangement diagram showing the configuration of a part of a memory cell array 14 in FIG. 1.

FIG. 6 is an arrangement diagram showing a part of the configuration of the memory cell array 14 in FIG. 1.

Here, for the purpose of explanation, a main decoder 38 which is a part of the row decoder, a column decoder 12 and a part of the sense amplifier band 16 are depicted for reference.

FIG. 6 shows parts corresponding to the bit lines BL0 to BL2 and /BL0 to /BL2 as well as the word lines WL0 to WL7. The bit lines BL0 and /BL0 are, as a bit line pair, connected to a sense amplifier SA in the sense amplifier band 16 and to an equalizing circuit EQ.

In the same manner, the bit lines BL1 and /BL1 form a bit line pair and the bit lines BL2 and /BL2 form a bit line pair. The sense amplifiers SA in the sense amplifier band are activated in accordance with the signal SO1 and the equalizing circuits EQ are activated in accordance with the signal BLEQ1. The word lines WL0 to WL7 are arranged so as to be perpendicular to the bit lines. Memory cells are arranged to correspond to intersection parts between the bit lines and the word lines.

Such an arrangement of memory cells is referred to as a "half pitch cell" arrangement. The description of the characteristics thereof is as follows: along the memory cell columns corresponding to the bit line BL0, a group of memory cells, which correspond to the intersections between the bit line BL0 and the word lines WL3, WL7, . . . that are activated by the pre-decode signal X3, and a group of memory cells, which correspond to the intersections between the bit line BL0 and the word lines WL0, WL4, . . . that are activated by the pre-decode signal X0, are provided.

In this memory cell column, each memory cell makes a pair with an adjacent memory cell so as to share a bit line contact CW for making a connection with the bit line BL0.

Along the memory cell columns corresponding to the bit line /BL0 which adjoins the bit line BL0, memory cells which correspond to the intersections between the bit line /BL0 and the word lines WL1, WL5, . . . that are activated by the pre-decode signal X1, and memory cells which correspond to the intersections between the bit line /BL0 and the word lines WL2, WL6, . . . that are activated by the pre-decode signal X2, are provided.

In this memory cell column, each memory cell makes a pair with an adjacent memory cell so as to share a bit line contact CW for making a connection with the bit line /BL0.

Such a pattern is arranged and is repeated in the row direction along the word lines. With respect to each memory cell column along the bit lines, FIG. 6 shows that the arrangement intervals of the bit line contacts CW provided in the bit line are the basic arrangement pitch for a basic layered unit. The memory cell column is shifted relative to the adjacent memory cell columns in the arrangement of the basic layout units. This shift is half of the basic arrangement pitch.

In addition, the connection of a memory cell is described. For example, the memory cell MC0 is arranged corresponding to the intersection between the word line WL3 and the bit line BL0 and, when the word line WL3 is activated the capacitor in the memory cell MC0 is connected to the bit line BL0.

The memory cell MC1 is arranged corresponding to the intersection between the word line WL4 and the bit line BL0 and, when the word line WL4 is activated, the capacitor in the memory cell MC1 is connected to the bit line BL0.

The memory cell MC2 is arranged corresponding to the intersection between the word line WL3 and the bit line BL1 and, when the word line WL3 is activated, the capacitor in the memory cell MC2 is connected to the bit line BL1.

The memory cell MC3 is arranged corresponding to the intersection between the word line WL4 and the bit line BL1 and, when the word line WL4 is activated, the capacitor in the memory cell MC3 is connected to the bit line BL1.

The memory cell MC4 is arranged corresponding to the intersection between the word line WL5 and the bit line /BL0 and, when the word line WL5 is activated, the capacitor in the memory cell MC4 is connected to the bit line /BL0.

The memory cell MC5 is arranged corresponding to the intersection between the word line WL6 and the bit line /BL0 and, when the word line WL6 is activated, the capacitor in the memory cell MC5 is connected to the bit line /BL0.

The memory cell MC6 is arranged corresponding to the intersection between the word line WL5 and the bit line /BL1 and, when the word line WL5 is activated, the capacitor in the memory cell MC6 is connected to the bit line /BL1.

The memory cell MC7 is arranged corresponding to the intersection between the word line WL6 and the bit line /BL1 and, when the word line WL6 is activated, the capacitor in the memory cell MC1 is connected to the bit line /BL1.

Figure 7:
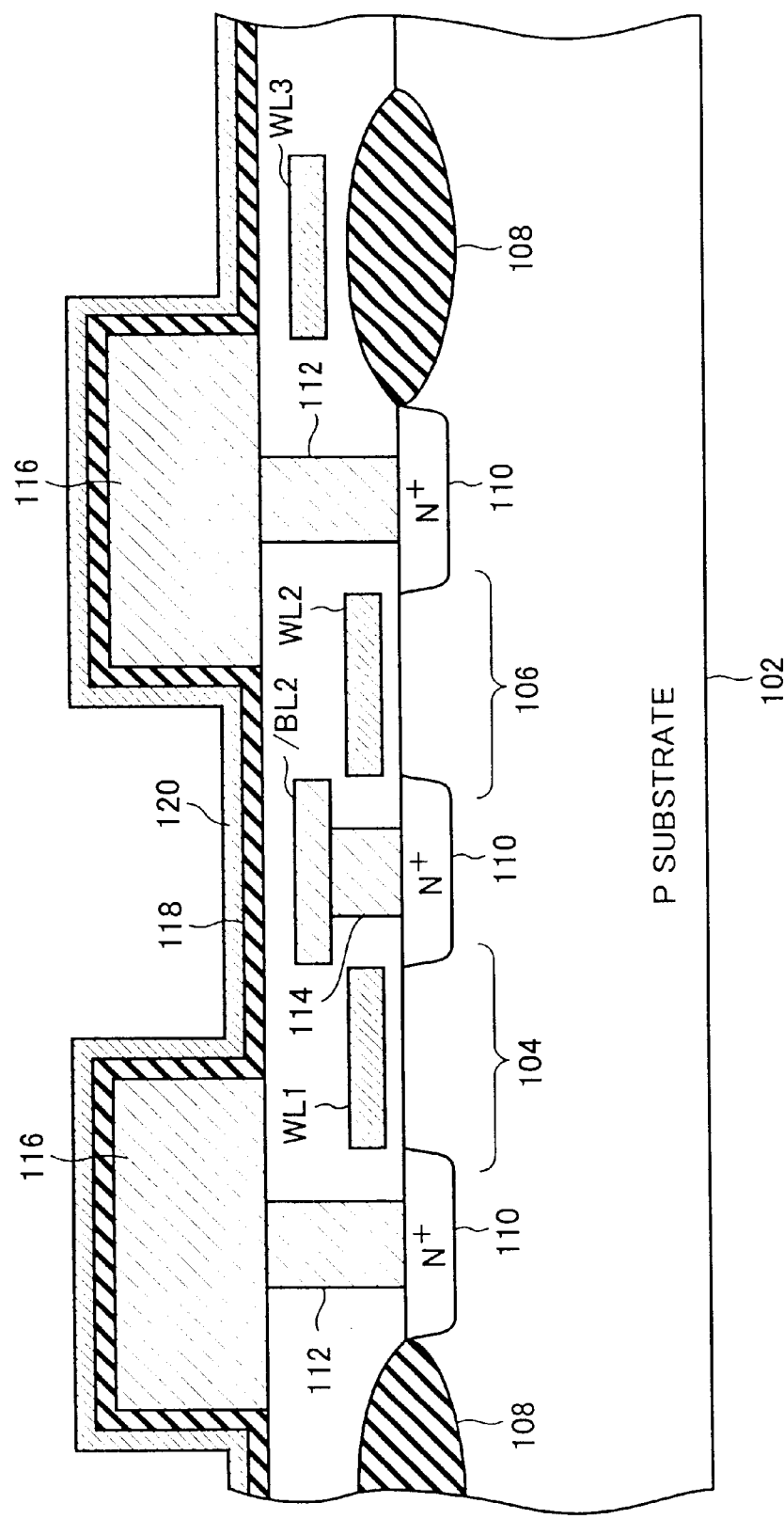
FIG. 7 is a cross section view along A—A in FIG. 6.

FIG. 7 is a cross section view along A—A in FIG. 6.

Referring to FIG. 7, N type impurity regions 110 are formed in the surface part of a P substrate 102 and the impurity regions are isolated to each other by an element isolation film 108. A word line WL1 and a word line WL2 are formed above the regions between an impurity region 110 and an impurity region 110 and transfer gates 104 and 106 are formed corresponding to the word lines WL1 and WL2. These transfer gates are N channel MOS transistors in FIG. 7. In addition, in the cross section along A—A, WL3 is formed above the element isolation film 108. The impurity region 110 between the word line WL1 and WL2 is connected with the bit line /BL2 by means of a bit line contact 114.

Electrodes 116 which correspond to storage nodes are formed and the electrodes 116 are connected to the impurity regions 110 by means of storage node contacts 112. A capacitance insulating film 118 is formed over the electrodes 116 and then a cell plate electrode film 120 is formed over the capacitance insulating film.

The contact windows CW in FIG. 6 correspond to the bit line contacts 114 in FIG. 7. In addition, the capacitors CAP in FIG. 6 correspond to capacitors formed of the electrodes 116 and the cell plate electrode film 120.

Figure 8:
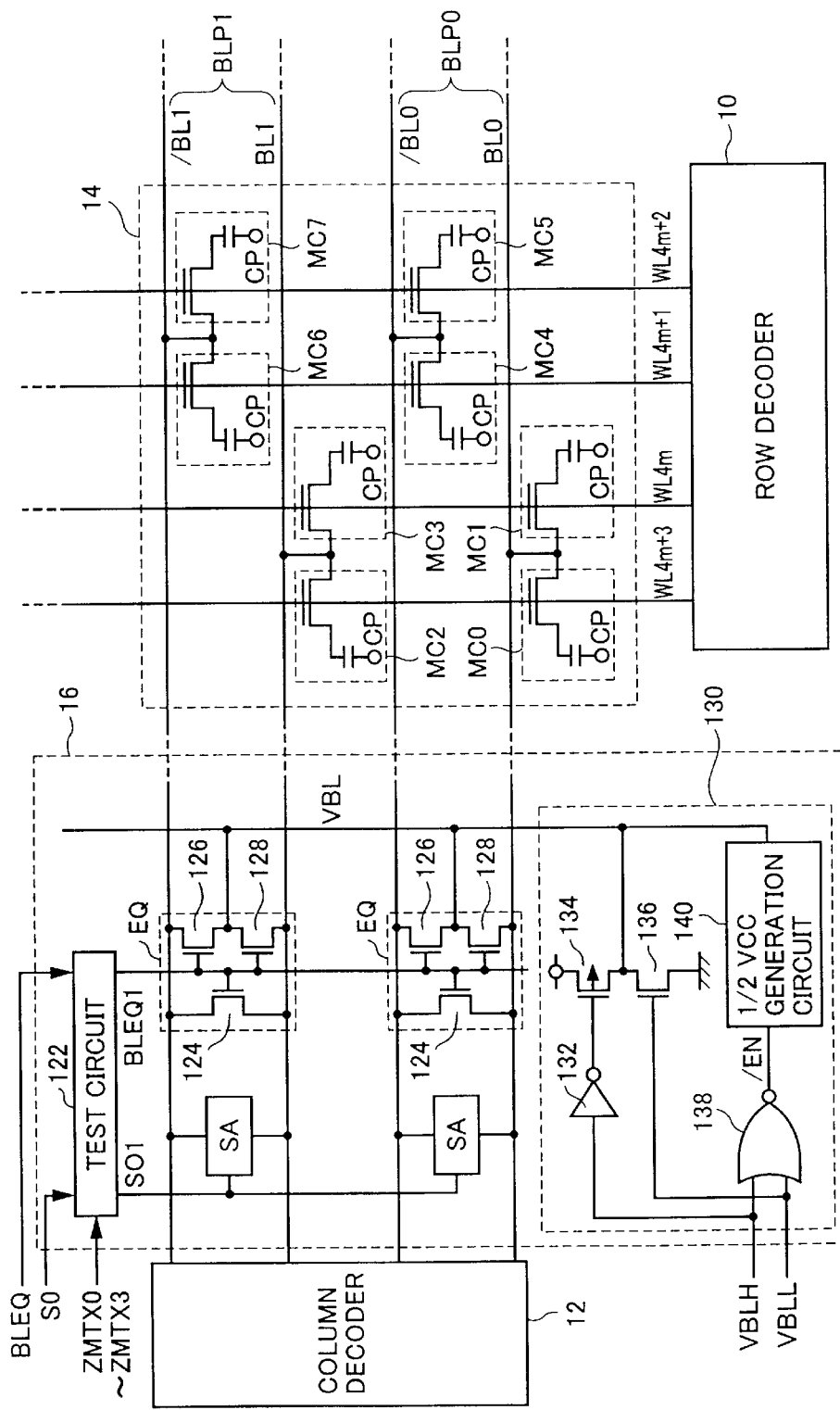
FIG. 8 is a circuit diagram for describing a circuit corresponding to the arrangement in FIG. 6.

FIG. 8 is a circuit diagram for describing a circuit which corresponds to the arrangement of FIG. 6.

Referring to FIG. 8, the memory cell array 14 is connected to the word line WL4m to WL4m+3 selected by the row decoder 10 and the bit line pairs BLP0 and BLP1. The bit line pair BLP0 includes the bit lines BL0 and /BL0. The bit line pair BLP1 includes the bit lines BL1 and /BL1.

The memory cells MC0 and MC2 are selected by the word lines WL4m+3 so as to be connected to the bit lines BL0 and BL1, respectively. The memory cells MC1 and MC3 are selected by the word line WL4m so as to be connected to the bit lines BL0 and BL1, respectively. The memory cells MC4 and MC6 are selected by the word line WL4m+1 so as to be connected to the bit lines /BL0 and /BL1, respectively. The memory cells MC5 and MC7 are selected by the word line WL4m+2 so as to be connected to the bit lines /BL0 and /BL1, respectively.

Each memory cell includes a capacitor of which one terminal is connected to the cell plate CP and a transfer gate which makes a connection between the other terminal of the capacitor and a corresponding bit line and which is activated in accordance with a corresponding word line.

The sense amplifier band 16 includes a VBL generation circuit 130 which outputs the potential VBL for equalizing bit lines, a test circuit 122 which outputs a sense amplifier activation signal SO1 and a bit line equalizing signal BLEQ1 in accordance with the bit line equalizing signal BLEQ and the sense amplifier activation signal SO as well as the test signals ZMTX0 to ZMTX3, sense amplifiers SA, for amplifying the voltage difference generated in bit line pairs, which is activated in accordance with the sense amplifier activation signal SO1, and equalizing circuits EQ for setting the potential in bit line pairs at the potential VBL in accordance with the bit line equalizing signal BLEQ1.

Each equalizing circuit EQ includes an N channel MOS transistor 124 which electrically connects two bit lines, which are complementary to each other, and N channel MOS transistors 126 and 128 for linking two bit lines, which are complementary to each other, to the potential VBL, respectively. The gates of the N channel MOS transistors 124 to 128 receive a bit line equalizing signal BLEQ1.

The VBL generation circuit 130 includes a NOR circuit 138 which receives test signals VBLH and VBLL so as to output a signal /EN and a ½ Vcc generation circuit 140 which outputs a potential which is one half of the power source potential Vcc when the signal /EN is at the "L" level.

The VBL generation circuit 130 further includes an inverter 132 which inverts by receiving a test signal VBLH, a P channel MOS transistor 134 which links the output node of the VBL generation circuit 130 to the power source potential in accordance with the output of the inverter 132 and an N channel MOS transistor 136 which links the output node of the VBL generation circuit 130 to the ground potential in accordance with the output of the test signal VBLL.

Figures 9, 10:
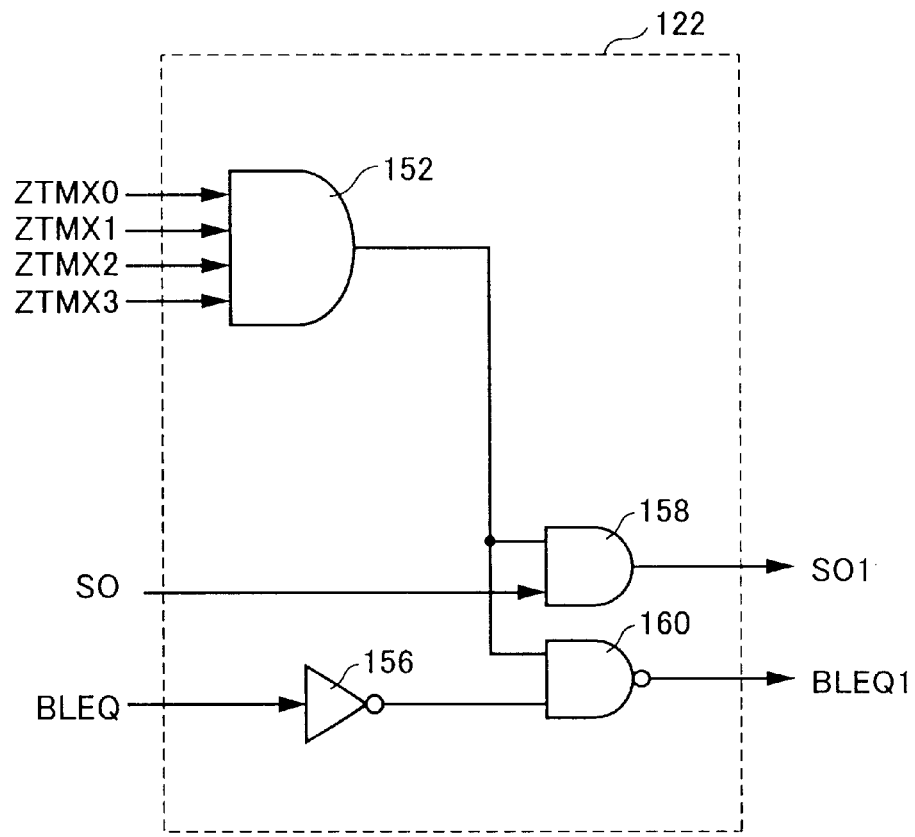
FIG. 9 is a circuit diagram showing the configuration of a test circuit 122 in FIG. 8.
FIG. 10 is a diagram for describing the operation of the test circuit 122 as shown in FIG. 9.

FIG. 9 is a circuit diagram showing the configuration of the test circuit 122 in FIG. 8.

Referring to FIG. 9, the test circuit 122 includes an AND circuit 152 which receives test signals ZTMX0 to ZTMX3, an AND circuit 158 which receives a sense amplifier activation signal SO and the output of the AND circuit 152 so as to output a sense amplifier activation signal SO1, an inverter 156 which inverts by receiving a bit line equalizing signal BLEQ and a NAND circuit 160 which receives the output of the inverter 156 and the output of the AND circuit 152 so as to output a bit line equalizing signal BLEQ1.

FIG. 10 is a diagram for describing the operation of the test circuit 122 as shown in FIG. 9.

Referring to FIGS. 9 and 10, at the time of the normal operation, since all the test signals ZMTX0 to ZMTX3 are set at the "H" level, the AND circuit 158 outputs the sense amplifier activation signal SO, without change, as the sense amplifier activation signal SO1. In addition, the NAND circuit 160 receives the output of the inverter 156 and outputs the inverted signal at the time of the normal operation so as to output a bit line equalizing signal BLEQ1 which has the same polarity as of the bit line equalizing signal BLEQ.

On the other hand, at the time of the test operation, each of the test signals ZMTX0 to ZMTX3 is set either at "H" or "L" in accordance with the address signal which is given from the outside. At this time, the sense amplifier activation signal SO1 is set at the "L" level while the bit line equalizing signal BLEQ1 is set at the "H" level. Accordingly, at the time of the test operation, the sense amplifiers are deactivated so as not to carry out any amplification operations on the bit lines. On the other hand, the bit line equalizing circuits are activated at the time of the test operation and set the potential of the bit line pairs at the potential VBL.

Figure 11:
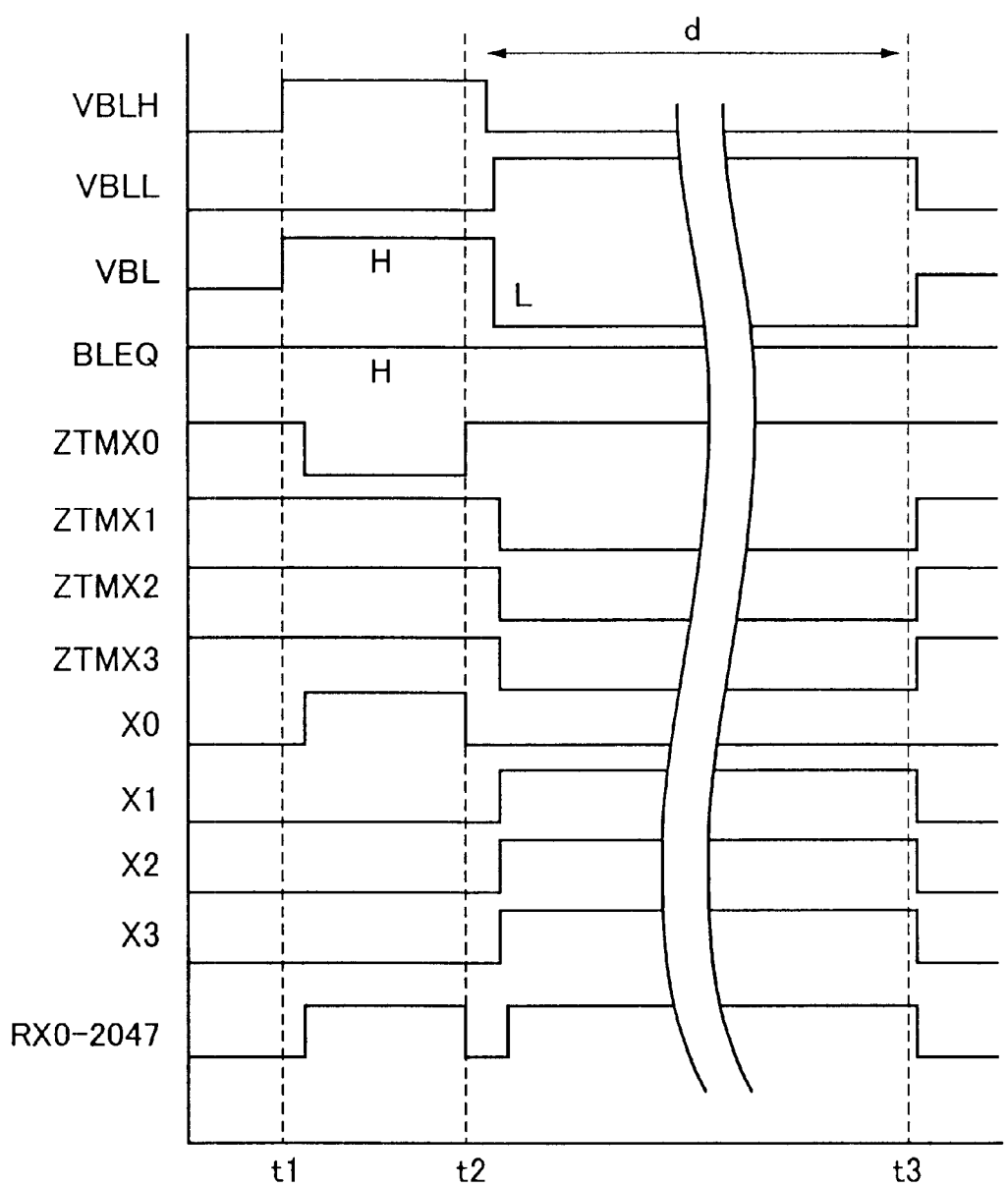
FIG. 11 is an operation waveform diagram for describing the carrying out of the pattern writing in the semiconductor memory device according to the first embodiment.

FIG. 11 is an operation waveform diagram for describing the carrying out of the pattern writing in a semiconductor memory device according to the first embodiment.

Referring to FIG. 11, first, the potential VBL becomes a potential corresponding to the data "H" by setting the test signal VBLH at the "H" level. At this time, the test signal ZTMX0 is set at the "L" level, while the test signals ZTMX1 to ZTMX3 are set at the "H" level. Then, the row decoder 10 as shown in FIG. 5 allows the pre-decode signal X0 to become the "H" level and allows the pre-decode signals X1 to X3 to become the "H" level. In addition, the pre-decode signals RX0 to RX2047 become the "H" level.

Then, the word lines which are activated in accordance with the pre-decode signal X0 are all activated. That is to say, one fourth of the entire word lines is activated. Then, the "H" data are written into all the memory cells connected to these word lines.

Next, at the time t2, the test signal ZTMX0 is returned to the "H" level while the test signal VBLH is returned to the "L" level. Then, the test signal VBLL is set at the "H" level so that the potential VBL becomes a potential which corresponds to the "L" data.

Next, when the test signals ZTMX1 to ZTMX3 are activated at the "H" level, the pre-decode signals X1 to X3 become the "H" level and the pre-decode signals RX0 to RX2047 become the "H" level.

Then, the word lines selected in accordance with the pre-decode signals X1 to X3 are all activated. That is to say, three fourths of the entire word lines are activated so that the "L" data can be written into all the memory cells connected to these word lines collectively. Here, while the above described test operation is carried out, the sense amplifier activation signal SO1 is non-activated to the "L" level by the test circuit 122 and the bit line equalizing signal BLEQ1 is activated to the "H" level.

Then, by maintaining this condition until the time t3, a detection of a short circuit between memory cells can be carried out. After a constant period of time d has passed the test signals ZTMX1 to ZTMX3 are returned to the "H" level and the test signal VBLL is returned to the "L" level and then data of the noteworthy cell are read out. In the case that there is a short circuit between SN—SN, the data of the noteworthy cell are inverted so that the data of "L" are read out. Accordingly it is possible to detect defective cells.

Figure 12:
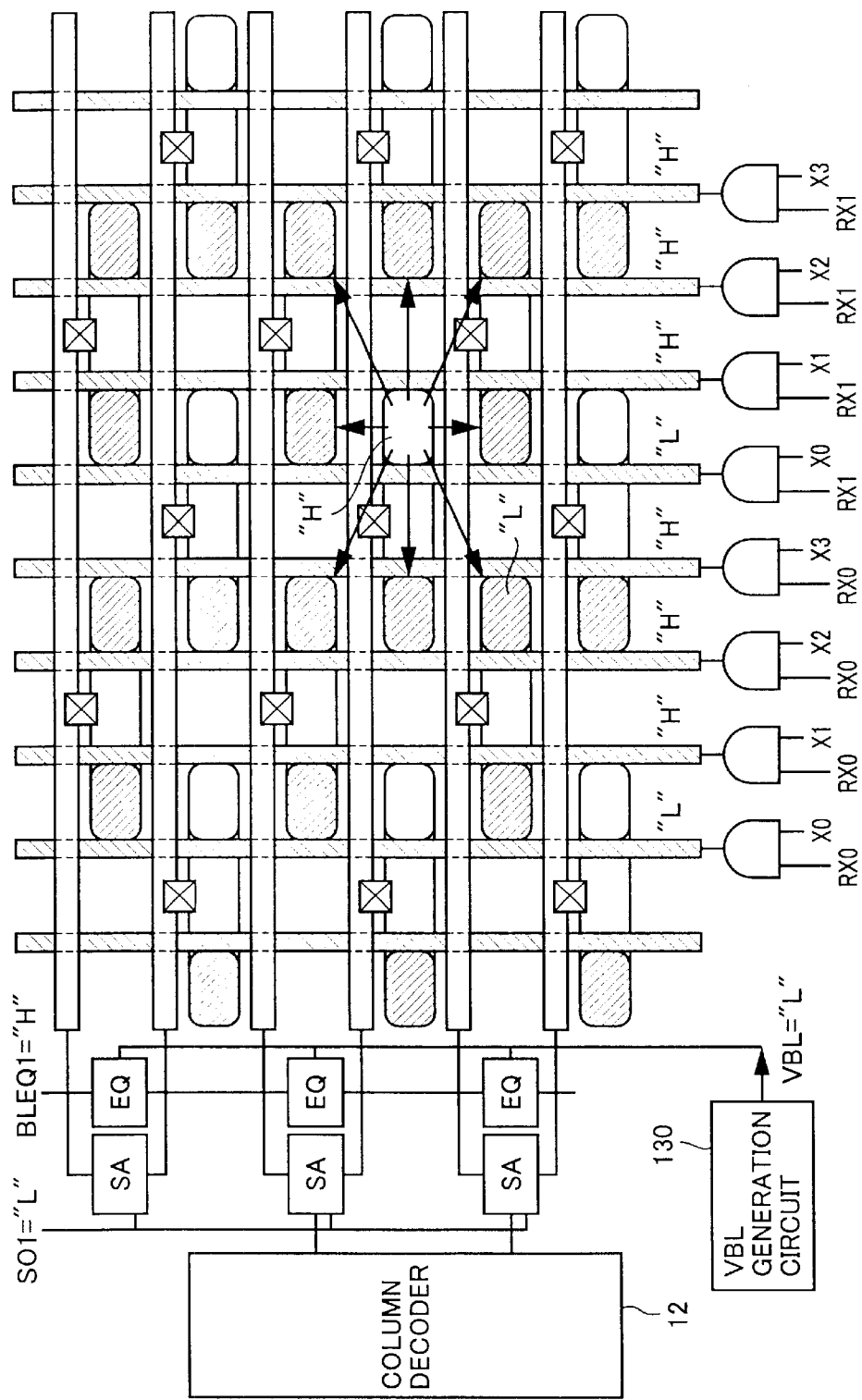
FIG. 12 is a diagram for describing the conditions of the time t2 to t3 in FIG. 11.

FIG. 12 is a diagram for describing the conditions of the time t2 to t3 in FIG. 11.

Referring to FIGS. 11 and 12, during the time t2 to t3, the potential of the word lines selected in accordance with the pre-decode signal X0 becomes the "L" level and the potential of the word lines selected in accordance with other pre-decode signals X1 to X3 becomes the "H" level. Under this condition, the potential VBL is supplied to the bit line from the equalizing circuit EQ via the VBL generation circuit 130. At this time, the potential VBL is a potential which corresponds to the data "L."

Accordingly, a potential which corresponds to the data "L" continues to be supplied to the 8 adjacent cells surrounding the noteworthy cell from any of the bit lines and, therefore, it becomes possible to forcefully carry out the detection of a short circuit between the noteworthy cell and the adjacent cells. That is to say, it is not necessary to prevent the data of the adjacent cells from being affected by the data of the noteworthy cell by carrying out the writing of the "L" data repeatedly in the adjacent cells unlike in a prior art. Accordingly, in the case of the comparison during the same pause period, the detection performance is higher in the test using the configuration of the present invention.

As described above, though a long period of time is required for writing the surrounding pattern over the entire surface according to the conventional method, it has become possible to write the surrounding pattern in a short period of time by collectively activating the word lines. For example, as for the time for writing the pattern once, in the case that it is assumed to take 100 ns for selecting a word line once to carry out the writing, the writing time per one pattern with 8192 word lines becomes 8192×100 (ns)=819.2 (ms)

and the noteworthy cell is changed in four ways and, in addition, it is necessary to carry out the tests for two types of polarities of the writing data and, therefore, 819.2 (ms)×4×2=6.553 (s)

That is to say, the writing time of the test pattern used to take approximately 6.5 seconds. According to the present invention, however, it becomes possible to shorten this time to approximately 10 ms at the most. Accordingly, it becomes possible to increase the productivity so as to produce products inexpensively through the test time reduction.

In addition, other effects can be expected according to the present invention.

Figure 13:
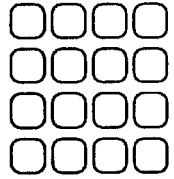
FIG. 13 is a diagram for describing other effects.
Figure 13:
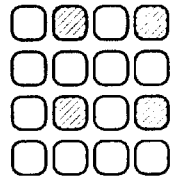
Figure 13:
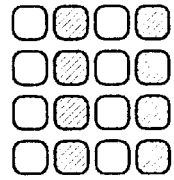
Figure 13:
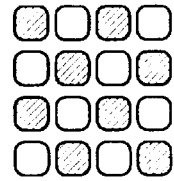
Figure 13:
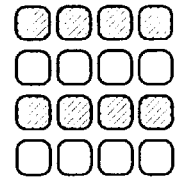

FIG. 13 is a diagram for describing these other effects.

Referring to FIG. 13, a group of word lines which are activated first is written in T1 while word lines which are activated second are written in T2.

First, by activating word lines corresponding to the pre-decode signals X0 to X3 at the same time, the first time (T1), 0, or 1, can be collectively written into all of the memory cells.

In this case, when the test signal VBLH is set at the "H" level 1 is collectively written into the entirety of the cells and, contrarily, when the test signal VBLL is set at the "H" level 0 is collectively written into the entirety of the cells.

Next, in the case of carrying out the writing of the surrounding pattern, first the word line which corresponds to the pre-decode signal X0 is activated and, next, the writing data are inverted so as to activate the word lines which correspond to the pre-decode signals X1 to X3. As for the combinations of the word line which is activated first and the word line which is activated subsequently, four ways can be considered.

The second combination is the case where the word lines which correspond to the pre-decode signals X0, X2 and X3 are activated after the word line which corresponds to the pre-decode signal X1 is first activated. The third combination is the case where the word lines which correspond to the pre-decode signals X0, X1 and X3 are activated after the word line which corresponds to the pre-decode signal X2 is first activated. The second combination is the case where the word lines which correspond to the pre-decode signals X0, X1 and X2 are activated after the word line which corresponds to the pre-decode signal X3 is first activated.

In addition, in accordance with the configuration of the semiconductor memory device according to the first embodiment, it is also possible to carry out the writing of the stripe pattern in the row direction. In this case, after first activating the word lines which correspond to the pre-decode signals X0 and X1 so as to write in data, the writing data are inverted and the word lines which correspond to the pre-decode signals X2 and X3 are activated so that data are written in.

It is also possible to write in a checkered pattern. In this case, first the word lines which correspond to the pre-decode signals X0 and X2 are activated so that data are written in and, after that, the data are inverted and the word lines which correspond to the pre-decode signals X1 and X3 are activated so that data are written in.

In addition, it is also possible to write in a stripe pattern in the column direction. In this case, first the word lines which correspond to the pre-decode signals X0 and X3 are activated so that data are written in and, then, the data are inverted and the word lines which correspond to the pre-decode signals X1 and X2 are activated so that the writing of data is carried out.

That is to say, by introducing the configuration of the present invention, it becomes possible to write in respective patterns of all 0/all1, row stripe, checkered pattern and column stripe which are necessary in a memory test, in addition to the surrounding pattern, in a shorter period of time than that for writing in by using a conventional writing function. Accordingly, the invention is very effective for the reduction of the test time period, that is to say, for increasing productivity.

[Second Embodiment]

A case of a cell arrangement of a so-called half pitch configuration is described in the first embodiment. A case of a cell arrangement of a so-called quarter pitch configuration is described in the second embodiment.

Figures 14, 15:
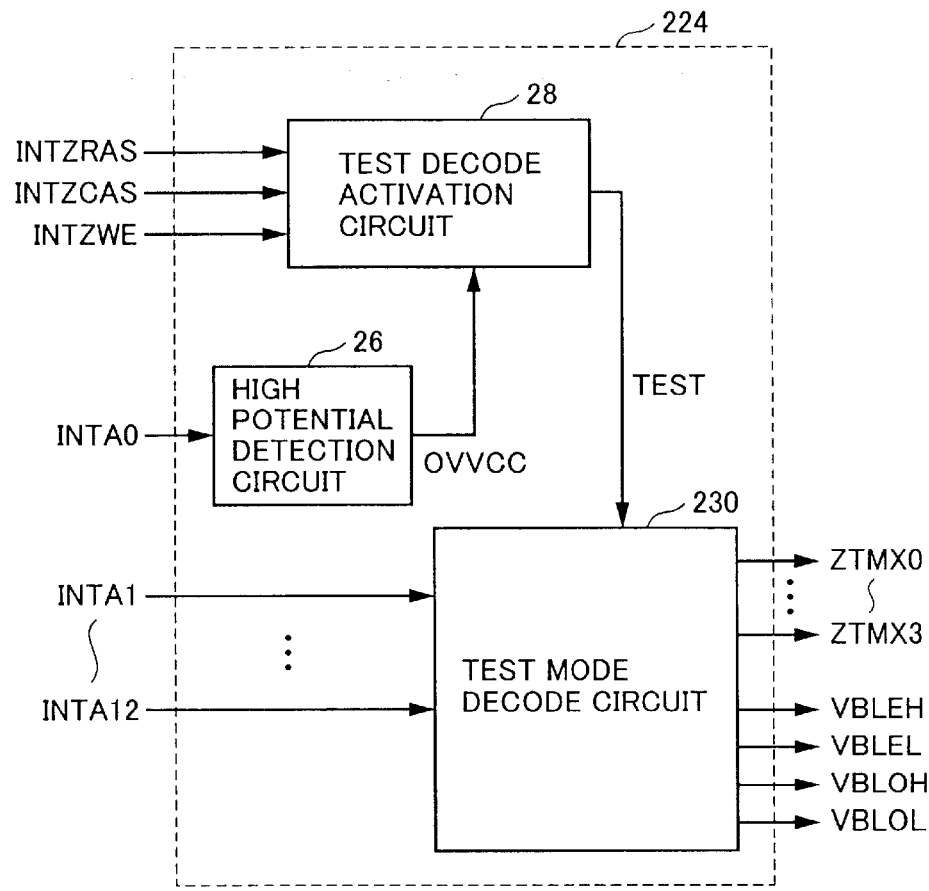
FIG. 14 is a circuit diagram showing the configuration of a test mode control circuit 224 used in a second embodiment.
FIG. 15 is a diagram for describing the operation of a test mode decode circuit 230 in FIG. 14.

FIG. 14 is a circuit diagram showing a configuration of a test mode control circuit 224 used in the second embodiment.

The test mode control circuit 224 includes a test mode decode circuit 230 in place of the test mode decode circuit 30 in the configuration of the test mode control circuit 24 as shown in FIG. 2. Other parts of the configuration are the same as in the test mode control circuit 24, of which the descriptions are not repeated.

FIG. 15 is a diagram for describing the operation of the test mode decode circuit 230 in FIG. 14.

Referring to FIGS. 14 and 15, at the time of normal operation where the test signal TEST is deactivated at the "L" level, the test signals ZMTX0 to XMTX3 are set at the "H" level.

In the case of the quarter pitch cells, the equalizing potentials VBLE and VBL0 are, respectively, given to bit line pairs of the even numbers and bit line pairs of the odd numbers, separately, in order to make possible the change of writing data in the bit line pairs of the even numbers and the bit line pairs of the odd numbers. The signals that designate the equalizing potential VBLE to the potentials corresponding to the "H" and "L" data are the test signals VBLEH and VBLEL, respectively. In addition, the signals that designate the equalizing potential VBLO to the potentials corresponding to the "H" and "L" data, respectively, are the test signals VBLOH and VBLOL.

Those test signals VBLEH, VBLEL, VBLOH and VBLOL are set at the "L" level at the time of normal operation.

At the time of the test mode where the test signal TEST is activated, when the potentials which correspond to data of (H, H), respectively, are given to the even number bit lines (EVEN) and the odd number bit lines (ODD), the test signals VBLEH, VBLEL, VBLOH and VBLOL are set at (H, L, H, L).

At the time of the test mode where the test signal TEST is activated, when the potentials which correspond to data of (H, L), respectively, are given to the even number bit lines (EVEN) and the odd number bit lines (ODD), the test signals VBLEH, VBLEL, VBLOH and VBLOL are set at (H, L, L, H).

At the time of the test mode where the test signal TEST is activated, when the potentials which correspond to data of (L, H), respectively, are given to the even number bit lines (EVEN) and the odd number bit lines (ODD), the test signals VBLEH, VBLEL, VBLOH and VBLOL are set at (L, H, H, L).

At the time of the test mode where the test signal TEST is activated, when the potentials which correspond to data of (L, L), respectively, are given to the even number bit lines (EVEN) and the odd number bit lines (ODD), the test signals VBLEH, VBLEL, VBLOH and VBLOL are set at (L, H, L, H).

Here, ZMTX0 to ZMTX3 control the address signal at the time of test operation and, thereby, free setting can be carried out in the same manner as in the cases described in FIGS. 2 and 3.

Figure 16:
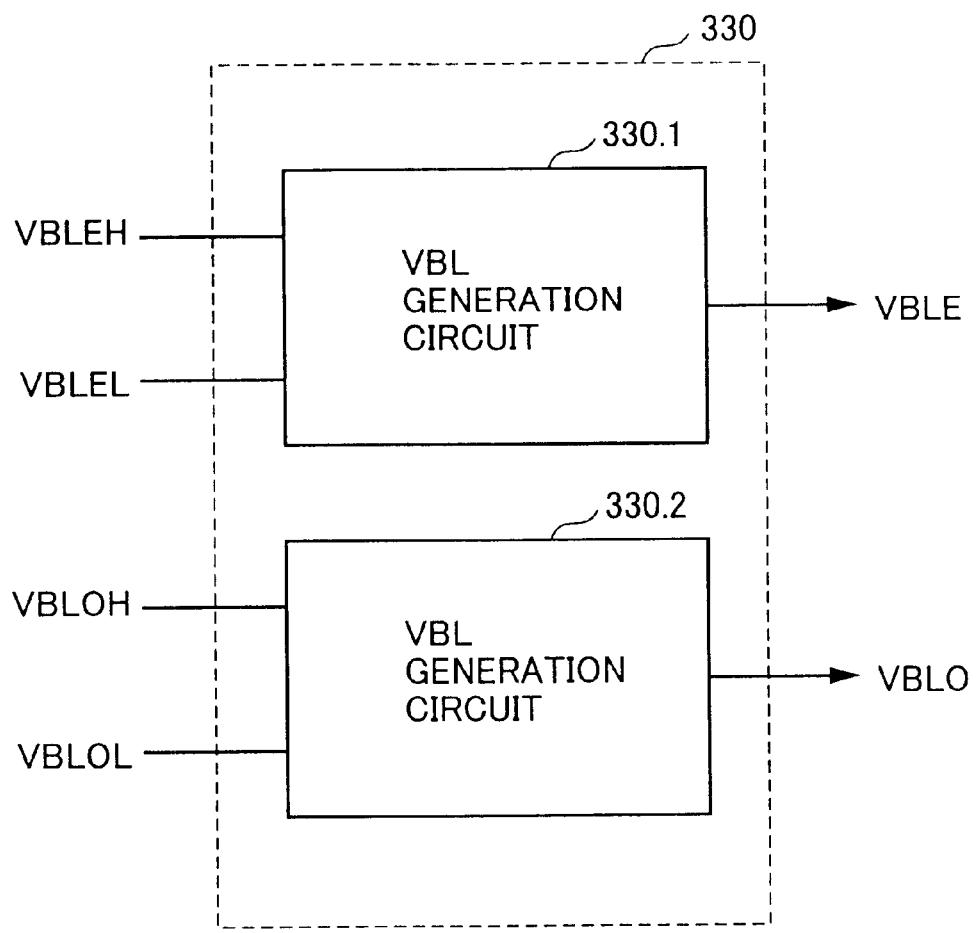
FIG. 16 is a circuit diagram showing the configuration of a VBL generation circuit 330 used in the second embodiment.

FIG. 16 is a circuit diagram showing the configuration of a VBL generation circuit 330 which is used in the second embodiment.

The VBL generation circuit 330 includes a VBL generation circuit 330.1 which outputs the potential VBLE in response to the test signals VBLEH and VBLEL and a VBL generation circuit 330.2 which outputs the potential VBLO in response to the test signals VBLOH and VBLOL. The respective configurations of the VBL generation circuits 330.1 and 330.2 are the same as of the VBL generation circuit 130 as shown in FIG. 8, of which the descriptions are not repeated.

Figure 17:
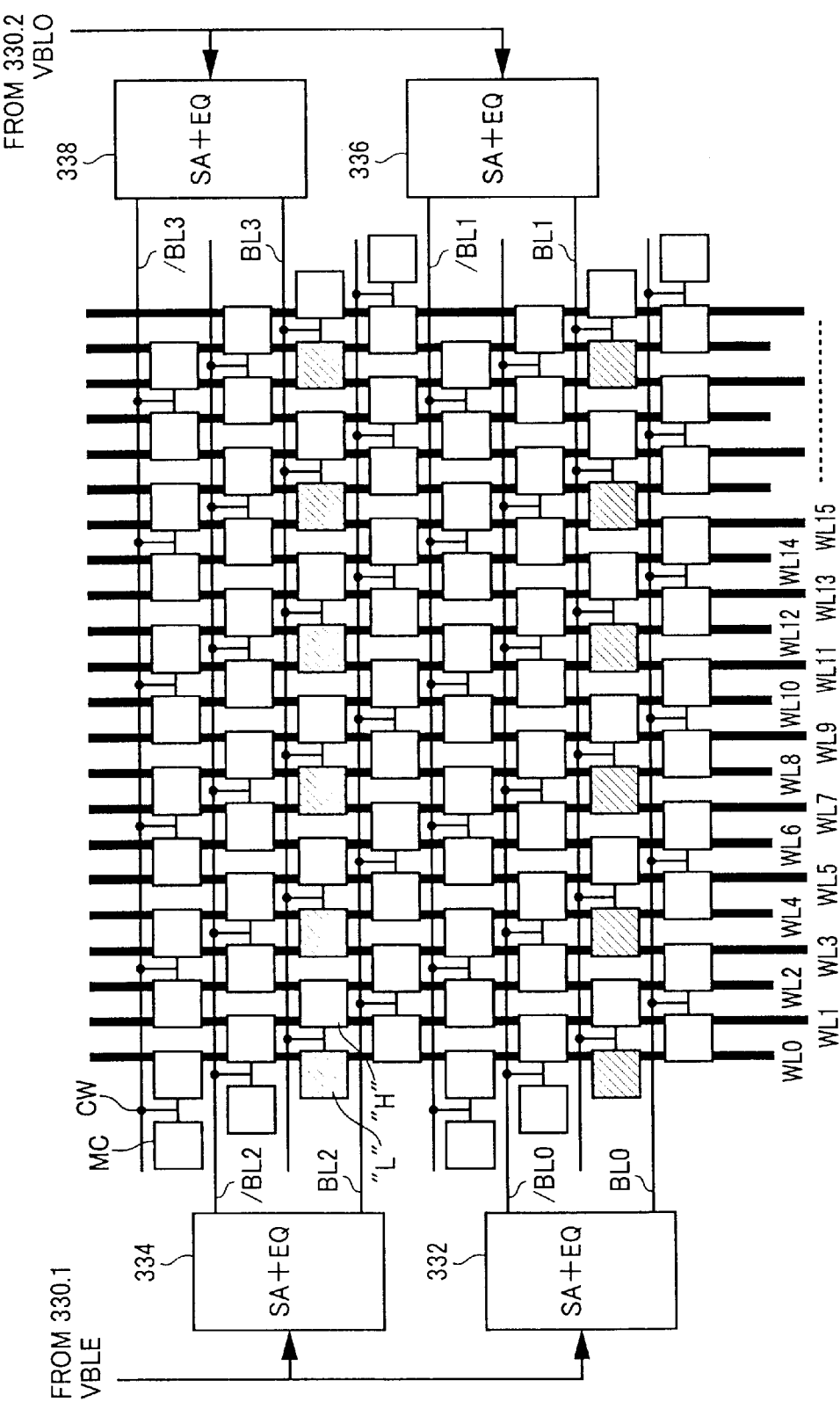
FIG. 17 is a diagram for describing the arrangement of memory cells in a quarter pitch configuration.
Figure 18:
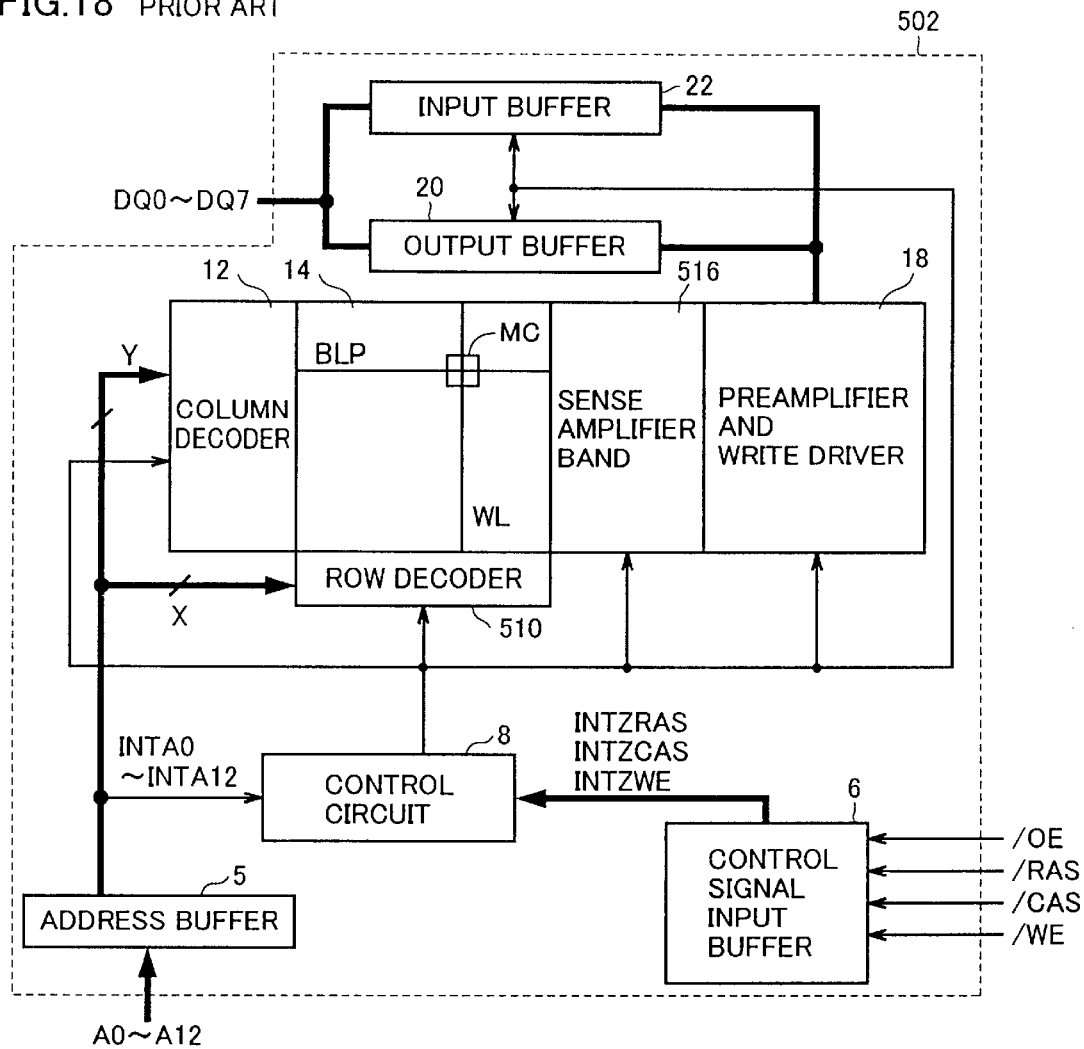
FIG. 18 is a block diagram showing a schematic configuration of a semiconductor memory device 502 according to a prior art.
Figure 19:
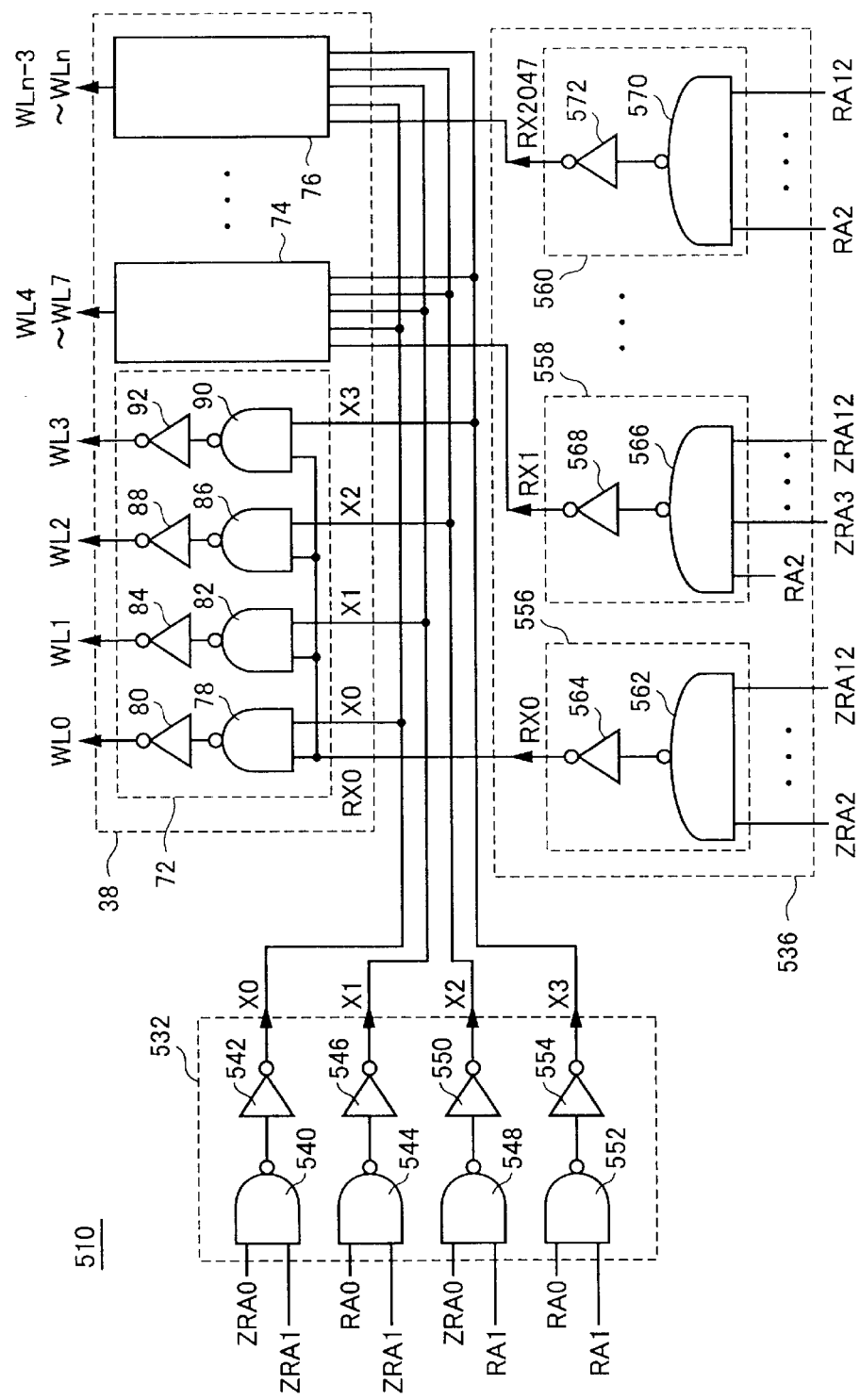
FIG. 19 is a circuit diagram showing the configuration of a row decoder 510 in FIG. 18.
Figure 20:
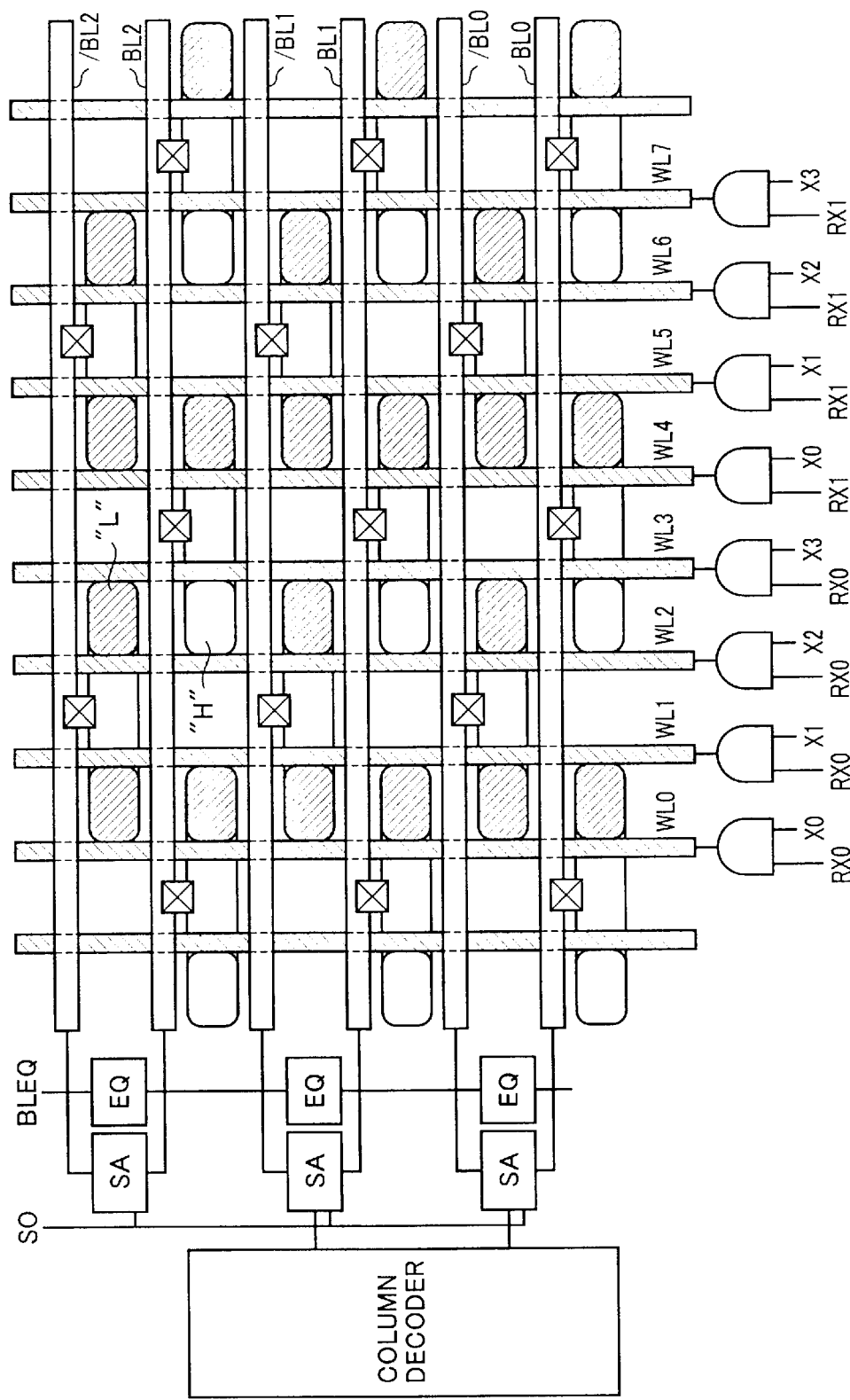
FIG. 20 is a diagram partially showing an overview of the memory cell arrangement of a memory cell array 14 as shown in FIG. 18.

FIG. 17 is a diagram for describing the arrangement of memory cells of a quarter pitch configuration.

Referring to FIG. 17, such an arrangement of memory cells is referred to as a "quarter pitch cell" arrangement. The description of the characteristics thereof is as follows: in the memory cell column which corresponds to the bit line BL0, a memory cell group which corresponds to the intersections between the bit line BL0 and every fourth word line WL1, WL5, . . . , and a memory cell group which corresponds to the intersections between the bit line BL0 and every fourth word line WL2, WL6, . . . , are provided.

In this memory cell column, each memory cell makes a pair with an adjacent memory cell so as to share the bit line contact CW for the connection with the bit line BL0.

In the memory cell column which corresponds to the bit line BL1 adjacent the bit line BL0, memory cells which correspond to the intersections between the bit line BL1 and every fourth word line WL0, WL4, . . . , and memory cells which correspond to the intersections between the bit line BL1 and every fourth word line WL1, WL5, . . . , are provided.

In this memory cell column, each memory cell makes a pair with an adjacent memory cell so as to share the bit line contact CW for the connection with the bit line BL1.

In the memory cell column which corresponds to the bit line /BL0 adjacent the bit line BL1, a memory cell group which corresponds to the intersections between the bit line /BL0 and every fourth word line WL0, WL4, . . . , and a memory cell group which corresponds to the intersections between the bit line BL0 and every fourth word line WL3, WL7, . . . , are provided.

In this memory cell column, each memory cell makes a pair with an adjacent memory cell so as to share the bit line contact CW for the connection with the bit line /BL0.

In the memory cell column which corresponds to the bit line /BL1 adjacent the bit line /BL0, memory cells which correspond to the intersections between the bit line /BL1 and every fourth word line WL2, WL6, . . . , and memory cells which correspond to the intersections between the bit line /BL1 and every fourth word line WL3, WL7, . . . , are provided.

In this memory cell column, each memory cell makes a pair with an adjacent memory cell so as to share the bit line contact CW for the connection with the bit line BL1.

Such a pattern is arranged and is repeated in the row direction along the word lines. In each of the memory cell columns along the bit lines, the arrangement intervals of the bit line contacts CW provided for the bit lines show the basic arrangement pitch of a basic layout unit in FIG. 17. The memory cell column is shifted relative to the adjacent memory cell column in the arrangement of the basic layout unit. This shift is one quarter of basic arrangement pitch.

Referring to FIG. 17, the operation of writing in the surrounding pattern in the quarter pitch cells is briefly described.

The sense amplifiers are divided into a group connected to the bit line pairs of the even numbers and a group connected to the bit line pairs of the odd numbers.

That is to say, the potential VBLE is given to the circuit 332 connected to the bit lines BL0 and /BL0 as well as to the circuit 334 connected to the bit lines BL2 and /BL2. Each of the circuits 332 and 334 include a sense amplifier SA and an equalizing circuit EQ.

The potential VBLO is given to the circuit 336 connected to the bit lines BL1 and /BL1 as well as to the circuit 338 connected to the bit lines BL3 and /BL3. Each of the circuits 336 and 338 include a sense amplifier SA and an equalizing circuit EQ.

First, the word lines WL0, WL4, WL8, . . . , are activated, the potential VBLE is set at the potential which corresponds to the "L" data and the potential VBL0 is set at the potential which corresponds to the "H" data. Then, the writing is carried out. After that, the remaining word lines, that is to say, the word lines WL1, WL2, WL3, WL5, WL6, WL7, . . . , are activated and the potentials VBLE and VBLO are both set at the potential which corresponds to the "H" data.

Thus, the data opposite to the data written into the noteworthy cell are written into the adjacent cells around the noteworthy cell. Accordingly, an SN—SN short circuit can be detected. Here, in the case of quarter pitch cells, four ways of activation of word lines and two patterns of potentials VBLE and VBL0, that is to say, 4×2=8 types of test patterns are necessary to be tested.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a test mode as an operational mode comprising:
   a memory array including a plurality of memory cells arranged in rows and columns;
   a plurality of bit lines arranged along the column direction and for carrying out the writing and reading of data to and from said plurality of memory cells;
   a plurality of word lines arranged along the row direction and for selecting a particular memory cell among said plurality of memory cells, said plurality of word lines being divided into first to fourth word line groups, said first word line group having word lines which correspond to the (4m +1)th, counting the first word line as the first among said plurality of word lines when m is a nonnegative integer, said second word line group having word lines which correspond to the (4m +2)th, counting said first word line as the first, said third word line group having word lines which correspond to the (4m +3)th, counting said first word line as the first, and said fourth word line group having word lines which correspond to the (4m +4)th, counting said first word line as the first; and a row decode circuit activating said plurality of word lines by using said first to fourth word line groups as a unit of activation in accordance with an address signal in said test mode.

2. The semiconductor memory device according to claim 1, wherein in a first memory cell column corresponding to the first bit line among said plurality of bit lines, a first memory cell group which corresponds to intersections between said first bit line and said first word line group as well as a second memory cell group which corresponds to intersections between said first bit line and said second word line group are provided, each memory cell in said first memory cell group shares, with an adjacent memory cell among said second memory cell group, a first bit line contact for the connection with said first bit line, in a second memory cell column which corresponds to the second bit line adjacent said first bit line, a third memory cell group which corresponds to intersections between said second bit line and said third word line group as well as a fourth memory cell group which corresponds to intersections between said second bit line and said fourth word line group are provided, and each memory cell in said third memory cell group shares, with an adjacent memory cell from among said fourth memory cell group, a second bit line contact for the connection with said second bit line.

3. The semiconductor memory device according to claim 2, wherein said address signal is a signal of a plurality of bits, said semiconductor memory device further comprises a test circuit for outputting first to fourth test signals in accordance with said address signal in said test mode; and said row decode circuit includes a first pre-decode circuit which decodes the predetermined two bits of said address signal in said normal mode and outputs first to fourth pre-decode signals and which outputs said first to fourth pre-decode signals in accordance with said first to fourth test signals in said test mode, a second pre-decode circuit which decodes the bits of said address signal other than said predetermined 2 bits in said normal mode and of which output is fixed in said test mode, and a main decode circuit for carrying out the activation of said plurality of word lines in accordance with the outputs of said first and second pre-decode circuits.

4. The semiconductor memory device according to claim 2, wherein said first and second bit lines make a bit line pair;

said semiconductor memory device further comprising:

first test circuit for outputting a test signal in accordance with the indication from the outside in said test mode;

a potential generation circuit which outputs a predetermined equalizing potential in said normal mode and which outputs a potential corresponding to either high or low data in accordance with said test signal in test mode; and an equalizing circuit for equalizing said bit line pair in accordance with the output of said potential generation circuit.

5. The semiconductor memory device according to claim 4, further comprising a second test circuit which carries out the activation of said equalizing circuit in accordance with an equalizing signal in said normal mode and which maintains said equalizing circuit in an active condition regardless of said equalizing signal in said test mode.

6. The semiconductor memory device according to claim 4, further comprising:

a sense amplifier for amplifying the potential difference between said bit line pair; and a second test circuit which carries out the activation of said sense amplifier in accordance with a sense amplifier activation signal in said normal mode and which deactivates said sense amplifier regardless of said sense amplifier activation signal in said test mode.

7. The semiconductor memory device according to claim 1, wherein said plurality of bit lines includes first to fourth bit lines arranged adjacent to each other in a sequential manner, a first memory cell column, which corresponds to said first bit line, is provided with a first memory cell group, which corresponds to intersections between said first bit line and said first word line group, and a second memory cell group, which corresponds to intersections between said first bit line and said second word line group, each memory cell in said first memory cell group shares, with an adjacent memory cell among said second memory cell group, a first bit line contact for the connection with said first bit line, a second memory cell column, which corresponds to said second bit line, is provided with a third memory cell group, which corresponds to intersections between said second bit line and said second word line group, and a fourth memory cell group, which corresponds to intersections between said second bitline and said third word line group, each memory cell in said third memory cell group shares, with an adjacent memory cell among said fourth memory cell group, a second bit line contact for the connection with said second bit line, a third memory cell column, which corresponds to said third bit line, is provided with a fifth memory cell group, which corresponds to intersections between said third bit line and said third word line group, and a sixth memory cell group, which corresponds to intersections between said third bit line and said four th word line group, each memory cell in said fifth memory cell group shares, with an adjacent memory cell among said sixth memory cell group, a third bit line contact for the connection with said third bit line, a fourth memory cell column, which corresponds to said fourth bit line, is provided with a seventh memory cell group, which corresponds to intersections between said fourth bit line and said fourth word line group, and anA eighth memory cell group, which corresponds to intersections between said fourth bit line and said first word line group, and each memory cell in said seventh memory cell group shares, with an adjacent memory cell among said eighth memory cell group, a fourth bit line contact for the connection with said fourth bit line.

8. The semiconductor memory device according to claim 7, wherein said address signal is a signal of a plurality of bits;

said semiconductor memory device further comprises a test circuit which outputs first to fourth test signals in accordance with said address signal in said test mode; and said row decode circuit includes a first pre-decode circuit which decodes the predetermined two bits of said address signal in said normal mode and outputs first to fourth pre-decode signals and which outputs said first to fourth pre-decode signals in accordance with said first to fourth test signals in said test mode a second pre-decode circuit which decodes the bits of said address signal other than said predetermined two bits in said normal mode and of which output is fixed in said test mode, and a main decode circuit which carries out the activation of said plurality of word lines in accordance with the outputs of said first and second pre-decode circuits.

9. The semiconductor memory device according to claim 7, wherein said first and third bit lines make a first bit line pair;

said second and fourth bit lines make a second bit line pair;

said semiconductor memory device further comprising:

a first test circuit outputting first and second test signals which are independently controllable in accordance with an indication from the outside in said test mode;

first and second potential generation circuits outputting predetermined equalizing potentials in said normal mode, and outputting, in accordance with said first and second test signals respectively in said test mode the potentials corresponding to either high or low data; and first and second equalizing circuits equalizing said first and second bit line pairs, respectively, in accordance with the outputs of said first and second potential generation circuits.

10. The semiconductor memory device according to claim 9, further comprising a second test circuit which carries out the activation of said first and second equalizing circuits in accordance with an equalizing signal in said normal mode and which maintains said first and second equalizing circuits in an active condition regardless of said equalizing signal in said test mode.

11. The semiconductor memory device according to claim 9, further comprising:

first and second sense amplifiers which amplify the potential differences of, respectively, said first and second bit line pairs; and a second test circuit which carries out the activation of said first and second sense amplifiers in accordance with a sense amplifier activation signal in said normal mode and which deactivate said first and second sense amplifiers regardless of said sense amplifier activation signal in said test mode.

* * * * *